US010686119B2

(12) United States Patent
Ohta et al.

(10) Patent No.: US 10,686,119 B2
(45) Date of Patent: Jun. 16, 2020

(54) PIEZOELECTRIC DEVICE

(71) Applicant: TDK CORPORATION, Tokyo (JP)

(72) Inventors: Yoshiki Ohta, Tokyo (JP); Masaichi Miyano, Tokyo (JP); Keiji Oguchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 541 days.

(21) Appl. No.: 15/616,127

(22) Filed: Jun. 7, 2017

(65) Prior Publication Data

US 2017/0358733 A1 Dec. 14, 2017

(30) Foreign Application Priority Data

Jun. 8, 2016 (JP) .................. 2016-114522

(51) Int. Cl.
| | | |
|---|---|---|
| *H01L 41/09* | (2006.01) | |
| *H01L 41/083* | (2006.01) | |
| *H01L 41/187* | (2006.01) | |
| *H02N 2/00* | (2006.01) | |
| *H01L 41/27* | (2013.01) | |
| *H01L 41/293* | (2013.01) | |
| *H01L 41/047* | (2006.01) | |
| *B06B 1/06* | (2006.01) | |
| *H01L 41/113* | (2006.01) | |
| *H01L 41/29* | (2013.01) | |
| *H01L 41/297* | (2013.01) | |

(52) U.S. Cl.
CPC ............ *H01L 41/27* (2013.01); *B06B 1/0648* (2013.01); *H01L 41/0471* (2013.01); *H01L 41/083* (2013.01); *H01L 41/113* (2013.01); *H01L 41/29* (2013.01); *H01L 41/293* (2013.01); *H01L 41/297* (2013.01); *H02N 2/007* (2013.01); *H02N 2/0025* (2013.01); *H02N 2/0075* (2013.01); *H01L 41/187* (2013.01)

(58) Field of Classification Search
USPC ......... 310/323.01–323.19, 323.21, 328, 359, 310/366
See application file for complete search history.

(56) References Cited

U.S. PATENT DOCUMENTS

| | | | | |
|---|---|---|---|---|
| 5,068,566 | A | * 11/1991 | Culp ................ | H02N 2/021 310/328 |
| 5,140,215 | A | * 8/1992 | Yamaguchi ............ | H02N 2/004 310/323.16 |
| 5,178,012 | A | * 1/1993 | Culp .................. | G01P 15/09 73/510 |
| 5,365,296 | A | 11/1994 | Murakami et al. | |
| 5,747,915 | A | * 5/1998 | Benavides ............. | H02N 2/105 310/306 |

(Continued)

FOREIGN PATENT DOCUMENTS

| | | |
|---|---|---|
| CN | 104347792 A | 2/2015 |
| JP | H04-165966 A | 6/1992 |

(Continued)

*Primary Examiner* — Thomas M Dougherty
(74) *Attorney, Agent, or Firm* — Oliff PLC

(57) ABSTRACT

A piezoelectric device includes a body provided with a first region and a second region lined along a first direction. The first region deformably extends/contracts along the first direction. The second region deformably curves in such a manner that one or the other side in a second direction intersecting the first direction curves outward.

8 Claims, 16 Drawing Sheets

(56) References Cited

U.S. PATENT DOCUMENTS

| | | | |
|---|---|---|---|
| 6,242,846 B1 * | 6/2001 | Ashizawa | H01L 41/0906 310/323.02 |
| 2008/0073999 A1 * | 3/2008 | Wischnewskij | H01L 41/0986 310/323.03 |
| 2008/0093953 A1 | 4/2008 | Koc et al. | |
| 2009/0033722 A1 | 2/2009 | Cruz-Uribe et al. | |
| 2013/0334933 A1 | 12/2013 | Ukai et al. | |
| 2015/0028723 A1 | 1/2015 | Ikeda et al. | |
| 2017/0214339 A1 * | 7/2017 | Wischnewskiy | H01L 41/0913 |

FOREIGN PATENT DOCUMENTS

| | | | |
|---|---|---|---|
| JP | 2008-099549 A | 4/2008 | |
| JP | 2010-219464 A | 9/2010 | |
| JP | 2013-147965 A | 8/2013 | |
| WO | 2012-117831 A1 | 9/2012 | |
| WO | WO-2016/012020 A1 * | 1/2016 | H02N 2/00 |

* cited by examiner

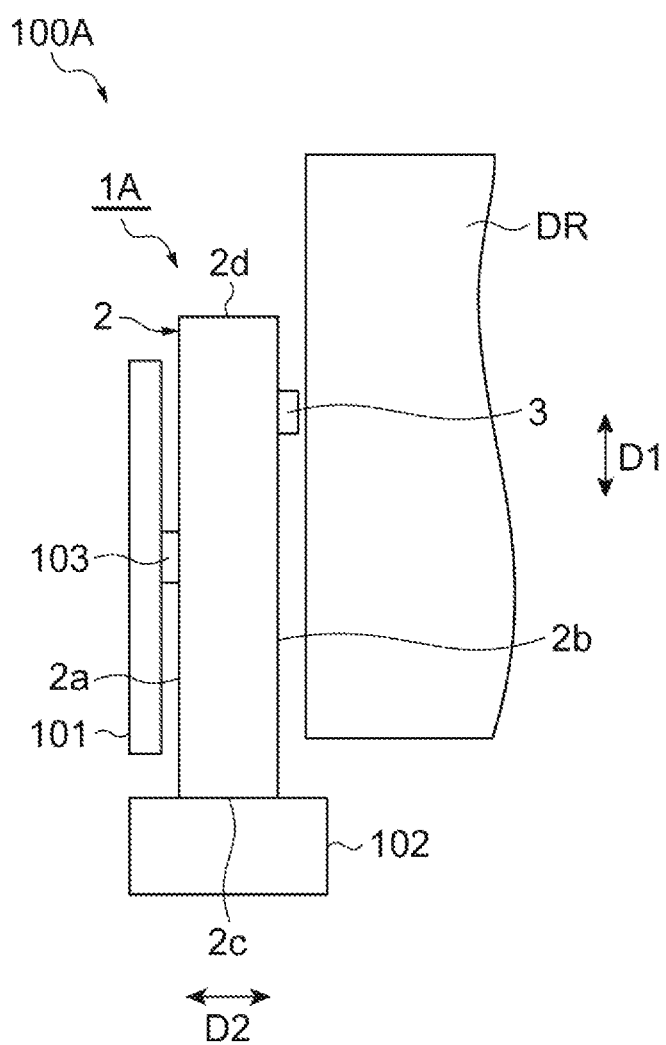

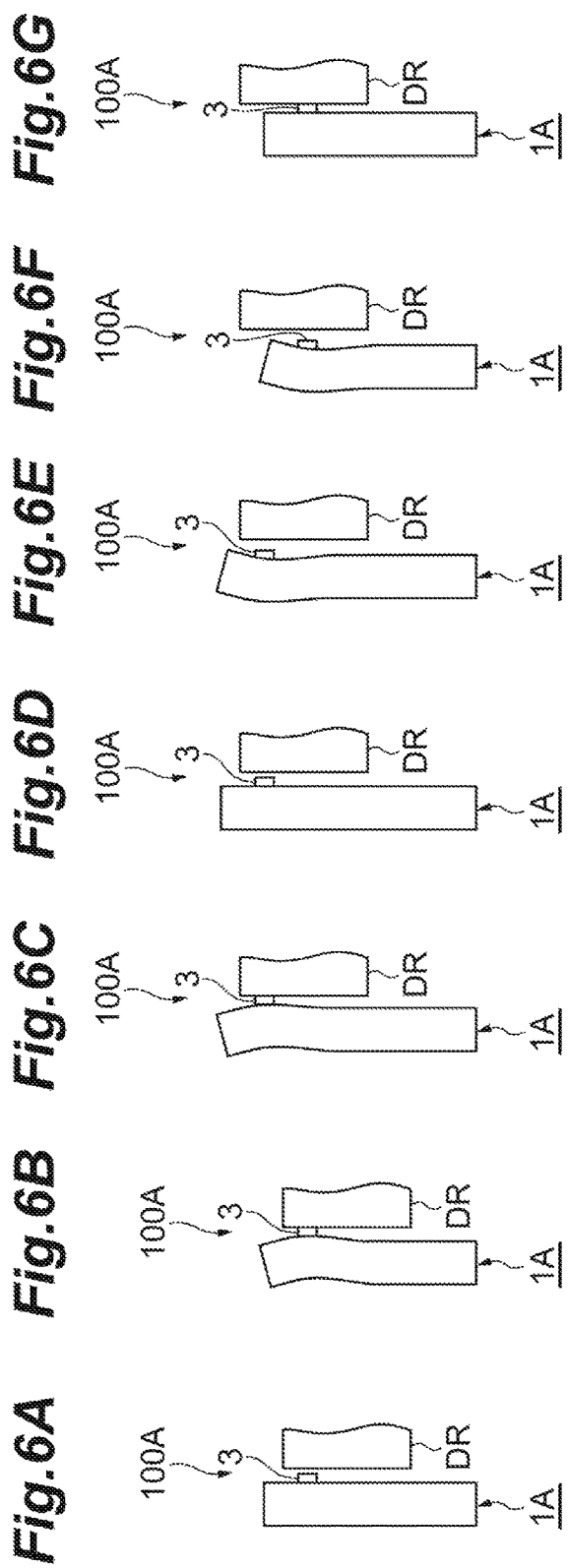

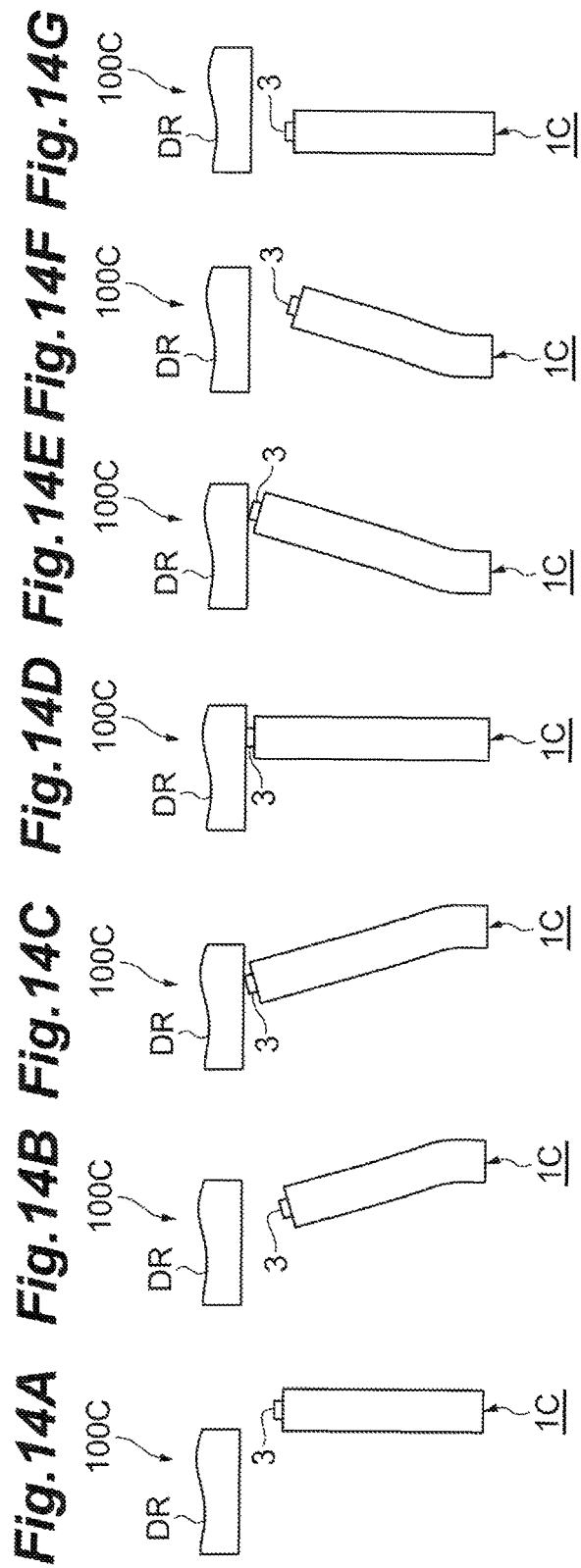

PIEZOELECTRIC DEVICE

TECHNICAL FIELD

An aspect of the present invention relates to a piezoelectric device.

BACKGROUND

Known piezoelectric devices are used as ultrasonic motors (for example, Japanese Unexamined Patent Publication No. 2008-99549 and No. 2010-219464). A piezoelectric device disclosed in each of these documents includes a body and a friction member attached to the body. Application of a voltage to the body generates a longitudinal vibration mode, and a flexural vibration mode in the body. In the former mode, the piezoelectric device oscillates in a longitudinal direction of the body. In the latter mode, the piezoelectric device oscillates in a thickness direction of the body. In accordance with this, the friction member is brought into contact with a driven body, moving in an elliptical manner and displaces the driven body by frictional force.

SUMMARY

In the aforementioned piezoelectric device, a friction member is easily abraded. Therefore, friction of the friction member may vary an amount of displacement of a driven body. In a case, for example, where the piezoelectric device includes a plurality of friction members, variation in features such as shapes of the plurality of friction members may also vary the amount of displacement of the driven body. To enhance reliability of the piezoelectric device, it is necessary to prevent such variation and to stably displace the driven body.

An object of an aspect of the present invention is to provide a piezoelectric device with high reliability.

The piezoelectric device according to an aspect of the present invention includes a body provided with first and second regions lined along a first direction. The first region is configured to deformably extend/contract along the first direction. The second region is configured to deformably curve in such a manner that one or the other side in a second direction intersecting the first direction curves outward.

In this piezoelectric device, the body includes the first region configured to extend/contract deformably; and the second region configured to curve deformably. Therefore, for example, a driven body can be displaced by deforming the first region to extend/contract while deforming the second region to curve in such a state where a surface of the second region to curve outward is brought into contact with the driven body. Furthermore, for example, the driven body can be displaced by deforming the second region to curve while deforming the first region to extend and bringing an end surface into contact with the driven body. In such a manner, it is possible to separately control a force to contact with the driven body and a force to drive the driven body. Therefore, each force can be adjusted easily. Accordingly, the driven body can be displaced stably. Thus, it is possible to enhance the reliability.

In the piezoelectric device according to an aspect of the present invention, the second region may include third and fourth regions lined along the second direction. The third and fourth regions may be configured to deformably extend/contract along the first direction, independently of each other. In this case, it is easy to deform the second region to curve.

In the piezoelectric device according to an aspect of the present invention, the first region may include a first piezoelectric body, and first and second electrodes disposed in the first piezoelectric body to oppose each other. The third region may include a second piezoelectric body, and third and fourth electrodes disposed in the second piezoelectric body to oppose each other. The fourth region may include a third piezoelectric body, and fifth and sixth electrodes disposed in the third piezoelectric body to oppose each other. The second electrode, fourth electrode, and sixth electrode may be ground electrodes. In this case, it is preferable to provide the first electrode, third electrode, and fifth electrode other than the ground electrodes. Accordingly, it is possible to simplify structures of the electrodes.

The piezoelectric device according to an aspect of the present invention may further include a friction member provided on the body and to be brought into contact with the driven body. In this case, it is possible to prevent abrasion of the body by the friction member.

In the piezoelectric device according to an aspect of the present invention, the friction member may be provided on the second region side. In this case, the friction member can be easily brought into contact with the driven body by deforming the second region to curve.

In the piezoelectric device according to an aspect of the present invention, a length of the first region along the first direction and a length of the second region along the first direction may be different from each other. In this case, it is easy to adjust a magnitude of the force to drive the driven body and that of the force to contact with the driven body.

BRIEF DESCRIPTION OF THE DRAWINGS

FIG. 4 is a side view of a piezoelectric actuator including the piezoelectric device illustrated in FIG. 1.

FIGS. 6A to 6G are views for describing a process to drive the piezoelectric actuator illustrated in FIGS. 5A to 5C.

FIGS. 14A to 14G are views for describing a process to drive a piezoelectric actuator including the piezoelectric device according to the third embodiment.

DETAILED DESCRIPTION

Figure 1:
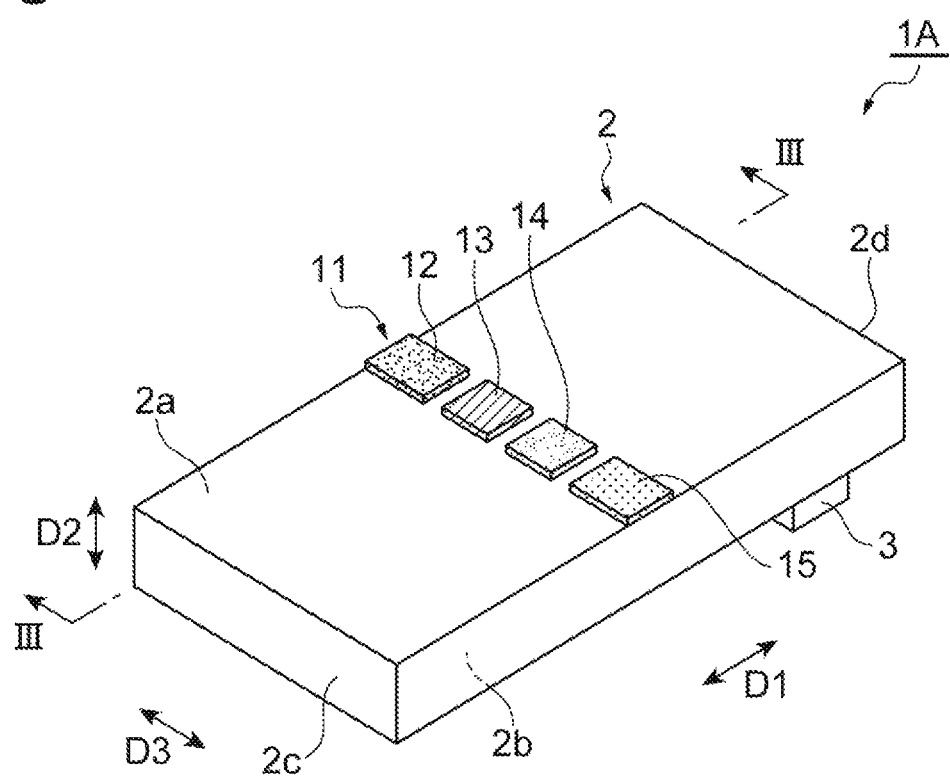
FIG. 1 is a perspective view illustrating a piezoelectric device according to a first embodiment.

An embodiment according to an aspect of the present invention will now be described in detail with reference to the accompanying drawings. Note that elements having common elements and features will be denoted with the same reference numerals and redundant explanations will be omitted herein.

First Embodiment

FIG. 1 is a perspective view illustrating a piezoelectric device according to a first embodiment. A piezoelectric device 1A according to the first embodiment illustrated in FIG. 1 is what is called a laminated piezoelectric device formed by laminating a plurality of piezoelectric body layers in an integrated manner. As an alternating-current voltage is applied to the piezoelectric device 1A, the piezoelectric device 1A is driven and works to move the after-mentioned driven body DR (see FIG. 4). The piezoelectric device 1A includes a body 2; and a friction member 3 provided on the body 2 and to be brought into contact with the driven body DR.

The body 2 has, for example, a cuboid shape. The body 2 includes a pair of principal surfaces 2a and 2b opposing each other; and a pair of end surfaces 2c and 2d opposing each other. The pair of principal surfaces 2a and 2b has, for example, a rectangular shape. Hereinafter, a direction along long sides of the pair of principal surfaces 2a and 2b or a direction in which the pair of end surfaces 2c and 2d are opposing each other will be represented by a first direction D1; a direction in which the pair of principal surfaces 2a and 2b is opposing each other will be represented by a second direction D2; and a direction along short sides of the pair of principal surfaces 2a and 2b will be represented by a third direction D3. Furthermore, in the body 2, a direction in which the principal surface 2a is provided indicates the upper side; and a direction in which the principal surface 2b is provided indicates the lower side. The body 2 has, for example, a size in the first direction D1 set to about 2.5 mm; a size in the second direction D2 set to about 0.5 mm; and a size in the third direction D3 set to about 1.3 mm.

Figure 2:
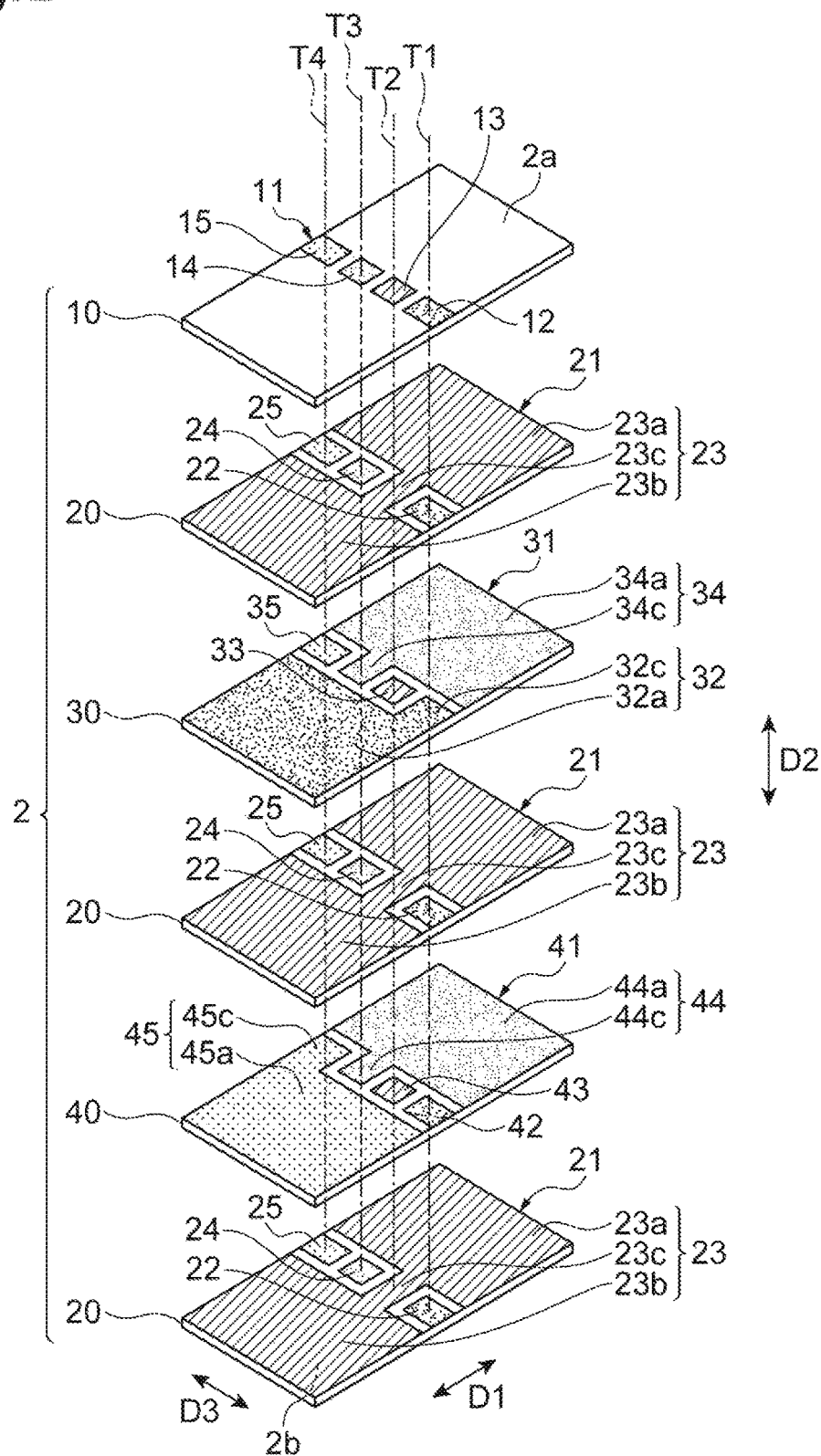
FIG. 2 is an exploded perspective view of a body illustrated in FIG. 1.
Figure 3:
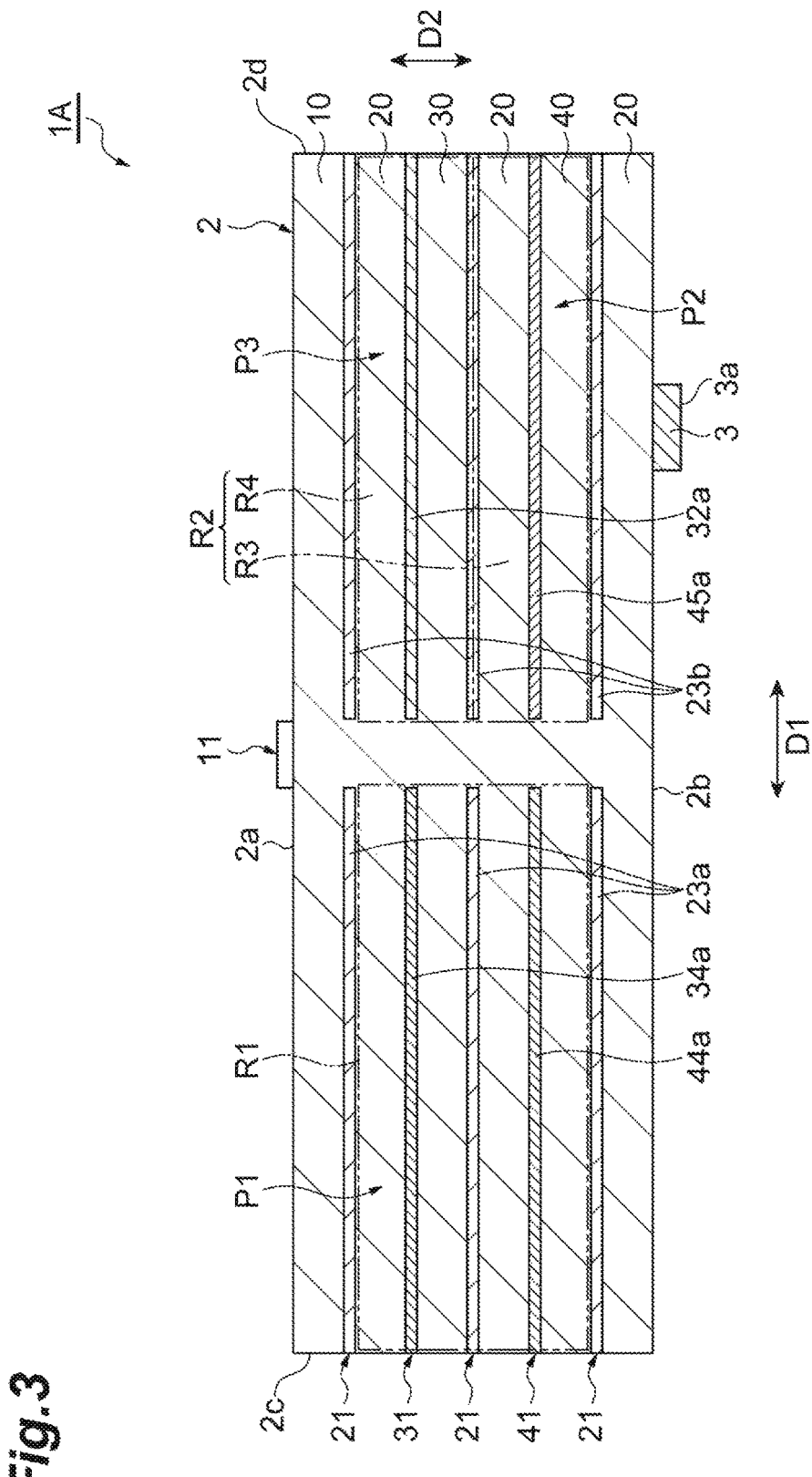
FIG. 3 is a cross sectional view taken along line III-III illustrated in FIG. 1.

FIG. 2 is an exploded perspective view of a body illustrated in FIG. 1. FIG. 3 is a cross sectional view taken along line III-III illustrated in FIG. 1. As illustrated in FIGS. 2 and 3, the body 2 is configured to include a laminated body in which piezoelectric body layers 10, 20, 30, and 40 having a rectangular plate-like shape with a piezoelectric feature and electrode layers 11, 21, 31, and 41 are laminated along the second direction D2. In production, first, a top surface of the piezoelectric body layer 10 is formed with the electrode layer 11; a top surface of the piezoelectric body layer 20 is formed with the electrode layer 21; a top surface of the piezoelectric body layer 30 is formed with the electrode layer 31; and a top surface of the piezoelectric body layer 40 is formed with the electrode layer 41. Next, the piezoelectric body layer 40 and electrode layer 41, and the piezoelectric body layer 20 and electrode layer 21 are alternately laminated n-times on the piezoelectric body layer 20 and electrode layer 21. Herein, n represents an integer of 1 or more, for example, 5. FIGS. 2 and 3 shows a case where n is 1, for sake of simplicity.

Then, the piezoelectric body layer 30 and electrode layer 31, and the piezoelectric body layer 20 and electrode layer 21 are alternately laminated m-times. Herein, m represents an integer of 1 or more, for example, 5. FIGS. 2 and 3 show a case where m is 1, for sake of simplicity. Finally, the piezoelectric body layer 10 and electrode layer 11 are laminated. Therefore, the principal surface 2a of the body 2 includes the top surface of the lastly-laminated piezoelectric body layer 10, and the principal surface 2b includes a bottom surface of the initially-laminated piezoelectric body layer 20.

In the real-life body 2, the plurality of piezoelectric body layers 10, 20, 30, and 40 are integrated in such a manner that each boundary between the layers cannot be viewed. The piezoelectric body layers 10, 20, 30, and 40 include a piezoelectric ceramic material such as lead zirconate titanate (PZT) as a primary component. A thickness of the piezoelectric body layers 10, 20, 30, and 40 (a length in the second direction D2) is, for example, about 10 μm or more and 100 μm or less.

The electrode layer 11 includes a first outside electrode 12; a ground outside electrode 13; a second outside electrode 14; and a third outside electrode 15. These electrodes are outside electrodes used when mounting other external equipment, and they are electrically insulated from each other. The first outside electrode 12, ground outside electrode 13, second outside electrode 14, and third outside electrode 15 are aligned along the third direction D3 in the order mentioned, disposed at a central position in the first direction D1 in the top surface of the piezoelectric body layer 10.

The first outside electrode 12 is formed in a quadrilateral shape, disposed in one end in the third direction D3, and configured to be connected to a voltage-output terminal of external equipment. The ground outside electrode 13 is formed in a quadrilateral shape, disposed between a central position in the third direction D3 and the first outside electrode 12, and configured to be connected to a ground terminal of external equipment. The second outside electrode 14 is formed in a quadrilateral shape, disposed between the central position in the third direction D3 and the third outside electrode 15, and configured to be connected to a ground terminal of external equipment. The third outside electrode 15 is formed in a quadrilateral shape, disposed in the other end in the third direction D3, and configured to be connected to a voltage-output terminal of external equipment.

The first outside electrode 12, ground outside electrode 13, second outside electrode 14, and third outside electrode 15 are formed by the following processes: that is, electrode paste including AgPd containing a material similar to that of the body 2 is transcribed on the principal surface 2a of the body 2, and then the principal surface 2a is baked at a predetermined temperature (for example, about 700° C.), followed by electroplating. Regarding the electroplating, Ni/Au and the like are employable.

The electrode layer 21 includes a first connecting electrode 22; a ground electrode 23; a second connecting electrode 24; and a third connecting electrode 25, all of which are electrically insulated from each other. The ground electrode 23 includes a pair of main electrode members 23a and 23b; and a connecting electrode member 23c. In the top surface of the piezoelectric body layer 20, the main electrode member 23a is formed in a quadrilateral shape to cover the substantially entire region ranging from the central position in the first direction D1 of the body 2 to the end surface 2c. In the top surface of the piezoelectric body layer 20, the main electrode member 23b is formed in a quadrilateral shape to cover the substantially entire region ranging from the central position in the first direction D1 of the body 2 to the end surface 2d of the first direction D1. In the central position in the first direction D1, the connecting electrode member 23c is connected to the pair of main electrode members 23a and 23b and is formed in a quadrilateral shape to overlap with the ground outside electrode 13 disposed in the upper side, when seen from the second direction D2.

In the central position in the first direction D1, the first connecting electrode 22 is formed in a quadrilateral shape to overlap with the first outside electrode 12 disposed in the upper side, when seen from the second direction D2. In the central position in the first direction D1, the second connecting electrode 24 is formed in a quadrilateral shape to overlap with the second outside electrode 14 disposed in the upper side, when seen from the second direction D2. In the central position in the first direction D1, the third connecting electrode 25 is formed in a quadrilateral shape to overlap with the third outside electrode 15 disposed in the upper side, when seen from the second direction D2.

The electrode layer 31 includes a first electrode 32; a ground connecting electrode 33; a second electrode 34; and a third connecting electrode 35, all of which are electrically insulated from each other. The first electrode 32 includes a main electrode member 32a; and a connecting electrode member 32c. In the top surface of the piezoelectric body layer 30, the main electrode member 32a is formed in a quadrilateral shape to cover the substantially entire region ranging from the central position in the first direction D1 of the body 2 to the end surface 2d. The connecting electrode member 32c is protruded from the main electrode member 32a toward the central position in the first direction D1 and is formed in a quadrilateral shape to overlap with the first outside electrode 12 disposed in the upper side, when seen from the second direction D2. In the central position of the first direction D1, the ground connecting electrode 33 is formed in a quadrilateral shape to overlap with the ground outside electrode 13 disposed in the upper side, when seen from the second direction D2.

The second electrode 34 includes a main electrode member 34a; and a connecting electrode member 34c. In the top surface of the piezoelectric body layer 30, the main electrode member 34a is formed in a quadrilateral shape to cover the substantially entire region ranging from the central position in the first direction D1 to the end surface 2c. The connecting electrode member 34c is protruded from the main electrode member 34a toward the central position in the first direction D1 and is formed in a quadrilateral shape to overlap with the second outside electrode 14 disposed in the upper side, when seen from the second direction D2. In the central position of the first direction D1, the third connecting electrode 35 is formed in a quadrilateral shape to overlap with the third outside electrode 15 disposed in the upper side, when seen from the second direction D2.

The electrode layer 41 includes a first connecting electrode 42; a ground connecting electrode 43; a second electrode 44; and a third electrode 45, all of which are electrically insulated from each other. In the central position of the first direction D1, the first connecting electrode 42 is formed in a quadrilateral shape to overlap with the first outside electrode 12 disposed in the upper side, when seen from the second direction D2. In the central position of the first direction D1, the ground connecting electrode 43 is formed in a quadrilateral shape to overlap with the ground outside electrode 13 disposed in the upper side, when seen from the second direction D2.

The second electrode 44 includes a main electrode member 44a; and a connecting electrode member 44c. In the top surface of the piezoelectric body layer 40, the main electrode member 44a is formed in a quadrilateral shape to cover the substantially entire region ranging from the central position in the first direction D1 to the end surface 2c. The connecting electrode member 44c is protruded from the main electrode member 44a toward the central position in the first direction D1 and is formed in a quadrilateral shape to overlap with the second outside electrode 14 disposed in the upper side, when seen from the second direction D2. The third electrode 45 includes a main electrode member 45a; and a connecting electrode member 45c. In the top surface of the piezoelectric body layer 40, the main electrode member 45a is formed in a quadrilateral shape to cover the substantially entire region ranging from the central position in the first direction D1 to the end surface 2d. The connecting electrode member 45c is protruded from the main electrode member 45a toward the central position in the first direction D1 and is formed in a quadrilateral shape to overlap with the third outside electrode 15 disposed in the upper side, when seen from the second direction D2.

A through-hole (not illustrated) along the second direction D2 is formed to penetrate the first outside electrode 12, connecting electrode member 32c, first connecting electrodes 22 and 42, a portion corresponding to the first outside electrode 12 in the piezoelectric body layer 10, portion corresponding to the first connecting electrode 22 in the piezoelectric body layer 20, portion corresponding to the connecting electrode member 32c in the piezoelectric body layer 30, and portion corresponding to the first connecting electrode 42 in the piezoelectric body layer 40. A through-hole conductor T1 is formed inside the through-hole. Accordingly, the first outside electrode 12, first electrode 32, and first connecting electrodes 22 and 42 are electrically connected to each other. A through-hole (not illustrated) along the second direction D2 is formed to penetrate the ground outside electrode 13, connecting electrode member 23c, and ground connecting electrodes 33 and 43, a portion corresponding to the ground outside electrode 13 in the piezoelectric body layer 10, portion corresponding to connecting electrode member 23c in the piezoelectric body layer 20, portion corresponding to the ground connecting electrode 33 in the piezoelectric body layer 30, and portion corresponding to the ground connecting electrodes 43 in the piezoelectric body layer 40. A through-hole conductor T2 is formed inside the through-hole. Accordingly, the ground outside electrode 13, ground electrode 23, and ground connecting electrodes 33 and 43 are electrically connected to each other.

A through-hole (not illustrated) along the second direction D2 is formed to penetrate the second outside electrode 14, connecting electrode members 34c and 44c, and second connecting electrode 24, a portion corresponding to the second outside electrode 14 in the piezoelectric body layer 10, portion corresponding to the second connecting electrode 24 in the piezoelectric body layer 20, portion corresponding to the connecting electrode member 34c in the piezoelectric body layer 30, and portion corresponding to the connecting electrode member 44c in the piezoelectric body layer 40. A through-hole conductor T3 is formed inside the through-hole. Accordingly, the second outside electrode 14, second electrodes 34 and 44, and second connecting electrode 24 are electrically connected to each other. A through-hole (not illustrated) along the second direction D2 is formed to penetrate the third outside electrode 15, connecting electrode member 45c, and third connecting electrodes 25 and 35, a portion corresponding to the third outside electrode 15 in the piezoelectric body layer 10, portion corresponding to third connecting electrode 25 in the piezoelectric body layer 20, portion corresponding to third connecting electrode 35 in the piezoelectric body layer 30, and portion corresponding to the connecting electrode member 45c in the piezoelectric body layer 40. A through-hole conductor T4 is formed inside the through-hole. Accordingly, the third outside electrode 15, third electrode 45, and third connecting electrodes 25 and 35 are electrically connected to each other.

The through-hole conductors T1, T2, T3, and T4 include a conductive material. The conductive material includes, for example, one or more types of metals selected from the group consisting of Pd, Ag, Cu, W, Mo, Sn and Ni or an alloy containing one or more types of the metals. The through-hole conductors T1, T2, T3, and T4 have a diameter, for example, ranging from 20 μm or more and 100 μm or less.

Hereinafter, each region included in the body 2 will be described with reference to FIG. 3. As illustrated in FIG. 3, the body 2 includes a first region R1 and a second region R2 lined along the first direction D1. The first region R1 and second region R2 are similar to each other in length along the first direction D1.

The first region R1 is on the end surface 2c side of the body 2. Specifically, the first region R1 is a region ranging from a main electrode member 23a disposed closest to the principal surface 2a among a plurality of main electrode members 23a (hereinafter referred to as "the uppermost main electrode member 23a") to a main electrode member 23a disposed closest to the principal surface 2b among those (hereinafter referred to as "the lowermost main electrode member 23a"). The first region R1 includes a piezoelectric body P1; the main electrode member 23a of the ground electrode 23; and the main electrode members 34a and 44a of the second electrodes 34 and 44. The piezoelectric body P1 includes portions disposed between the uppermost main electrode member 23a and lowermost main electrode member 23a in the piezoelectric body layers 20, 30, and 40. The main electrode members 23a, 34a and 44a are disposed in the piezoelectric body P1 to oppose each other along the second direction D2. Specifically, the uppermost main electrode member 23a and the lowermost main electrode member 23a are disposed in the surfaces of the piezoelectric body P1, and others are disposed inside the piezoelectric body P1.

The second region R2 is on the end surface 2d side of the body 2. Specifically, the second region R2 is a region ranging from a main electrode member 23b disposed closest to the principal surface 2a among a plurality of main electrode members 23b (hereinafter referred to as "the uppermost main electrode member 23b") to a main electrode member 23b disposed closest to the principal surface 2b among those (hereinafter referred to as "the lowermost main electrode member 23b"). The second region R2 includes a third region R3 and a fourth region R4 lined along the second direction D2 intersecting the first direction D1.

The second region R2 is separated into the third region R3 and fourth region R4 by a main electrode member 23b, among the plurality of main electrode members 23b, which is adjacent to the main electrode member 32a via the piezoelectric body layer 30 at one side in the second direction D2 and which is adjacent to the main electrode member 45a via the piezoelectric body layer 20 at the other end in the second direction D2 (hereinafter referred to as "the main electrode member 23b serving as a boundary"). The third region R3 is on the principal surface 2b side. The fourth region R4 is on the principal surface 2a side. Specifically, the third region R3 is a region ranging from the main electrode member 23b serving as the boundary to the lowermost main electrode member 23b. The fourth region R4 is a region ranging from the main electrode member 23b serving as the boundary to the uppermost main electrode member 23b.

The third region R3 includes a piezoelectric body P2; the main electrode member 23b of the ground electrode 23; and the main electrode member 45a of the third electrode 45. The piezoelectric body P2 includes portions disposed between the main electrode member 23b serving as the boundary and the lowermost main electrode member 23b in the piezoelectric body layers 20 and 40. The main electrode members 23b, 45a are disposed in the piezoelectric body P2 to oppose each other along the second direction D2. Specifically, the main electrode member 23b serving as the boundary and the lowermost main electrode member 23b are disposed in the surfaces of the piezoelectric body P2, and others are disposed inside the piezoelectric body P2.

The fourth region R4 includes a piezoelectric body P3; the main electrode member 23b of the ground electrode 23; and the main electrode member 32a of the first electrode 32. The piezoelectric body P3 includes portions disposed between the main electrode member 23b serving as the boundary and the uppermost main electrode member 23b in the piezoelectric body layers 20 and 30. The main electrode members 23b, 32a are disposed in the piezoelectric body P3 to oppose each other along the second direction D2. Specifically, the main electrode member 23b serving as the boundary and the uppermost main electrode member 23b are disposed in the surfaces of the piezoelectric body P3, and others are disposed inside the piezoelectric body P3.

Applying a voltage to the second outside electrode 14 generates an electric field between the main electrode members 34a, 44a and the main electrode member 23a. Accordingly, the first region R1 deformably extends/contracts along the first direction D1. Applying a voltage to the third outside electrode 15 generates an electric field between the main electrode member 45a and main electrode member 23b. Accordingly, the third region R3 deformably extends/contracts along the first direction D1. Applying a voltage to the first outside electrode 12 generates an electric field between the main electrode member 32a and the main electrode member 23b. Accordingly, the fourth region R4 deformably extends/contracts along the first direction D1.

As the third region R3 and fourth region R4 deformably extend/contract along the first direction D1, independently of each other, the second region R2 deformably curves in such a manner that one or the other side in the second direction D2 curves outward. For example, as the third region R3 deforms to extend and the fourth region R4 deforms to contract, the second region R2 deformably curves in such a manner that the third region R3 curves outward. In a reverse manner, as the third region R3 deforms to contract and the fourth region R4 deforms to extend, the second region R2 deformably curves in such a manner that the fourth region R4 curves outward.

In other words, driving the piezoelectric device 1 generates an extension vibration mode (longitudinal vibration mode) due to the first region R1; and a deflection vibration mode (flexural vibration mode) due to the second region R2.

The friction member 3 is provided on the second region R2 side of the body 2. The friction member 3 is attached to the principal surface 2b of the third region R3 side, for example, by adhesion. The friction member 3 is disposed to overlap with a central part in the first direction D1 of the second region R2, when seen from the second direction D2.

The friction member 3 is a rod-like member stretching along the third direction D3, including a contact part 3a to be brought into contact with the driven body DR. The friction member 3 is, for example, a pillar-like member having a quadrilateral cross section. The friction member 3 includes, for example, ceramic materials such as zirconia and alumina, SUS, and hard metals such as tungsten (W). The friction member 3 may be coated with diamond like carbon (DLC) and the like.

The friction member 3 has, for example, a quadrilateral cross section. In this case, the contact part 3a serves as a surface and an area of the contact part 3a increases. Therefore, desired frictional force can be easily yielded. The friction member 3 may have, for example, a semicircular cross section with a plane surface attached to the body 2 and a tip of a curved surface included in the contact part 3a. In this case, an area of the contact part 3a decreases, but damage such as a crack hardly occurs. Furthermore, there is no need to pay attention to parallelism with the driven body DR. The friction member 3 has, for example, a size in the first direction D1 set to about 0.3 mm; a size in the second direction D2 set to about 0.1 mm; and a size in the third direction D3 set to about 1.0 mm.

The friction member 3 is formed, for example, by adhering ceramic to a corresponding position in the principal surface 2b and then by abrading the same, followed by coating the abraded surface. Abrasion after adhesion makes it easy to form the contact part 3a and principal surface 2a parallel and to yield stable frictional force. After abrasion, it is preferable to remove abrasive grains by washing.

With reference to FIG. 4, hereinafter described is a structure of a piezoelectric actuator 100A in which the piezoelectric device 1A is applied.

FIG. 4 is a side view of a piezoelectric actuator including the piezoelectric device illustrated in FIG. 1. As illustrated in FIG. 4, the piezoelectric actuator 100A is, for example, an actuator employed for driving camera lens. The piezoelectric actuator 100A includes the piezoelectric device 1A; a flexible substrate 101 attached to the piezoelectric device 1A; and a fixing unit 102. The piezoelectric device 1A is disposed in such a manner that the friction member 3 opposes the driven body DR. The driven body DR includes, for example, ceramic materials such as zirconia and alumina, SUS, and hard metals such as tungsten (W). The driven body DR may be coated with DLC and the like.

The flexible substrate 101 is what is called flexible printed circuits (FPC). The flexible substrate 101 is attached to the electrode layer 11 by a conductive resin 103 (see FIG. 1) and is disposed to be pressed on the principal surface 2a. Instead of the conductive resin 103, solder may be employable. Seen from the second direction D2, the principal surface 2a is substantially entirely covered with the flexible substrate 101. Instead of employing the flexible substrate 101, a lead wire may be connected to the electrode layer 11.

The fixing unit 102 is attached to the end surface 2c of the piezoelectric device 1A. The fixing unit 102 is a rigid body serving as a weight to fix the piezoelectric device 1A. The fixing unit 102 includes, for example, tungsten (W). Without employing the fixing unit 102, the piezoelectric device 1A may be attached to a housing and the like of equipment in which the piezoelectric actuator 100A is applied.

Figure 5A:
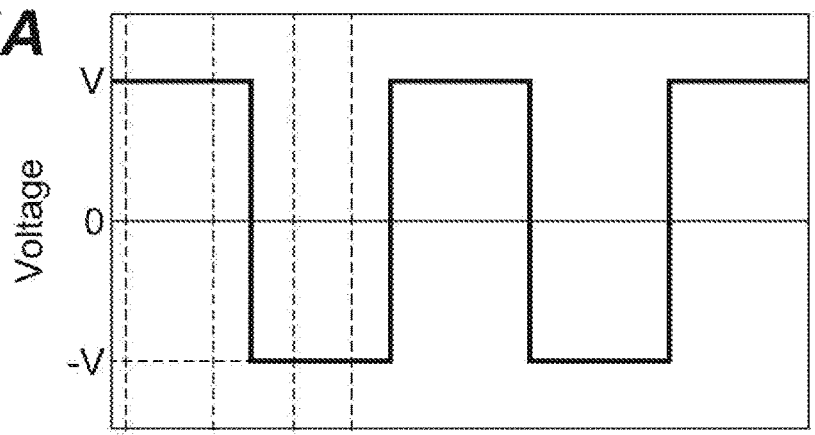
FIGS. 5A to 5C are views each illustrating a pattern of a voltage of each electrode.
Figure 5B:
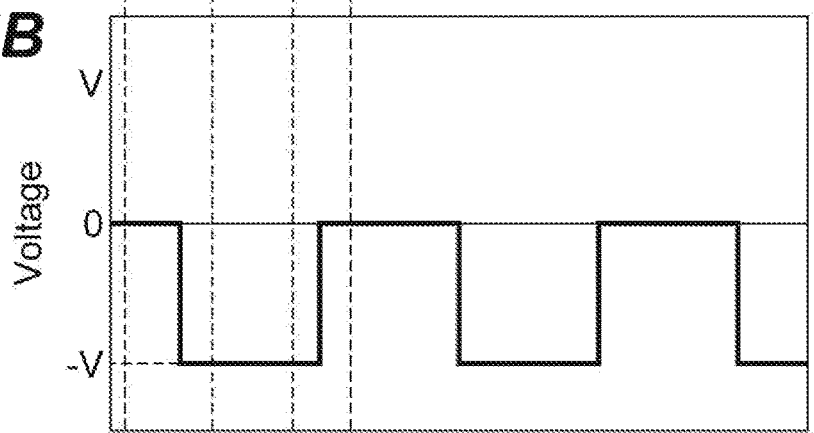
Figure 5C:
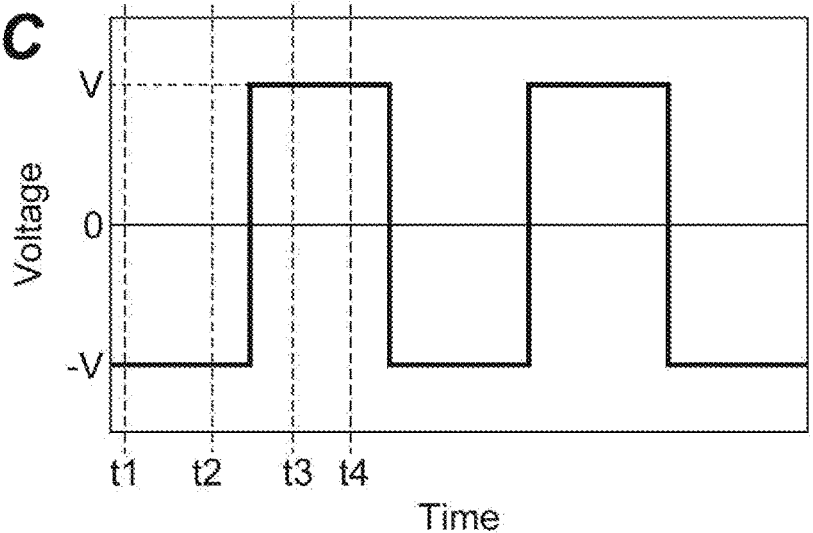

With reference to FIGS. 5A to 5C and FIGS. 6A to 6G, hereinafter described is a process to drive the piezoelectric actuator 100A. FIG. 5A is a view illustrating a pattern of a voltage of the first electrode. FIG. 5B is a view illustrating a pattern of a voltage of the second electrode. FIG. 5C is a view illustrating a pattern of a voltage of the third electrode.

In FIGS. 5A to 5C, time is taken along the abscissa and voltage is taken along the ordinate. FIGS. 6A to 6G are views for describing a process to drive the piezoelectric actuator. Hereinafter, a voltage to be applied to the first electrode 32 is represented by V1, a voltage to be applied to the second electrodes 34 and 44 is represented by V2, and a voltage to be applied to the third electrode 45 is represented by V3.

Applying a positive voltage to the second electrodes 34 and 44, the first region R1 deforms to contract along the first direction D1. Applying a negative voltage to the second electrodes 34 and 44, the first region R1 deforms to extend along the first direction D1. Applying a positive voltage to the third electrode 45, the third region R3 deforms to contract along the first direction D1. Applying a negative voltage to the third electrode 45, the third region R3 deforms to extend along the first direction D1. Applying a positive voltage to the first electrode 32, the fourth region R4 deforms to contract along the first direction D1. Applying a negative voltage to the first electrode 32, the fourth region R4 deforms to extend along the first direction D1.

FIG. 6A shows a state before driving the piezoelectric actuator 100 A. Herein, (V1, V2, V3)=(0, 0, 0) and the first region R1, third region R3, and fourth region R4 are in a state before deformation. Therefore, the friction member 3 is separated from the driven body DR.

FIG. 6B shows a state of a time t1. As illustrated in FIGS. 5A to 5C, in the time t1, (V1, V2, V3)=(V, 0, −V). Therefore, the fourth region R4 deforms to contract along the first direction D1, and the third region R3 deforms to extend along the first direction D1. Accordingly, as illustrated in FIG. 6B, the second region R2 deformably curves in such a manner that the third region R3 side curves outward and the friction member 3 is brought into contact with the driven body DR.

FIG. 6C shows a state of a time t2. As illustrated in FIGS. 5A to 5C, in the time t2, (V1, V2, V3)=(V, −V, −V). Therefore, the first region R1 deforms to extend along the first direction D1. Accordingly, as illustrated in FIG. 6C, the first region R1 deforms to extend along the first direction D1 while the friction member 3 is brought into contact with the driven body DR. Therefore, the driven body DR is driven upward along the first direction D1.

FIG. 6D shows a state where (V1, V2, V3)=(0, −V, 0) when the state of the time t2 transfers to that of a time t3. The third region R3 and fourth region R4 return to the state before deformation while the first region R1 deforms to extend. Accordingly, as illustrated in FIG. 6D, the friction member 3 returns to the state where the friction member 3 is separated from the driven body DR.

FIG. 6E shows the state of the time t3. As illustrated in FIGS. 5A to 5C, in the time t3, (V1, V2, V3)=(−V, −V, V). Therefore, the fourth region R4 deforms to extend along the first direction D1 and the third region R3 deforms to contract along the first direction D1. Accordingly, as illustrated in FIG. 6E, the second region R2 deformably curves in such a manner that the fourth region R4 side curves outward and the friction member 3 is further separated from the driven body DR.

FIG. 6F shows a state of a time t4. As illustrated in FIGS. 5A to 5C, in the time t4, (V1, V2, V3)=(−V, 0, V). Therefore, the first region R1 returns to the state before deformation. Accordingly, as illustrated in FIG. 6F, the first region R1 is contracted along the first direction D1 while the friction member 3 is further separated from the driven body DR.

FIG. 6G shows a state after driving the piezoelectric actuator 100A. The first region R1, third region R3, and fourth region R4 return to the state before driving. On the other hand, the driven body DR moves up along the first direction D1 compared to the state before driving. Before the friction member 3 is brought into contact with the driven body DR, the first region R1 may be deformed to contract along the first direction D1. Accordingly, it is possible to increase an amount of drive of the driven body DR.

Second Embodiment

Figure 7:
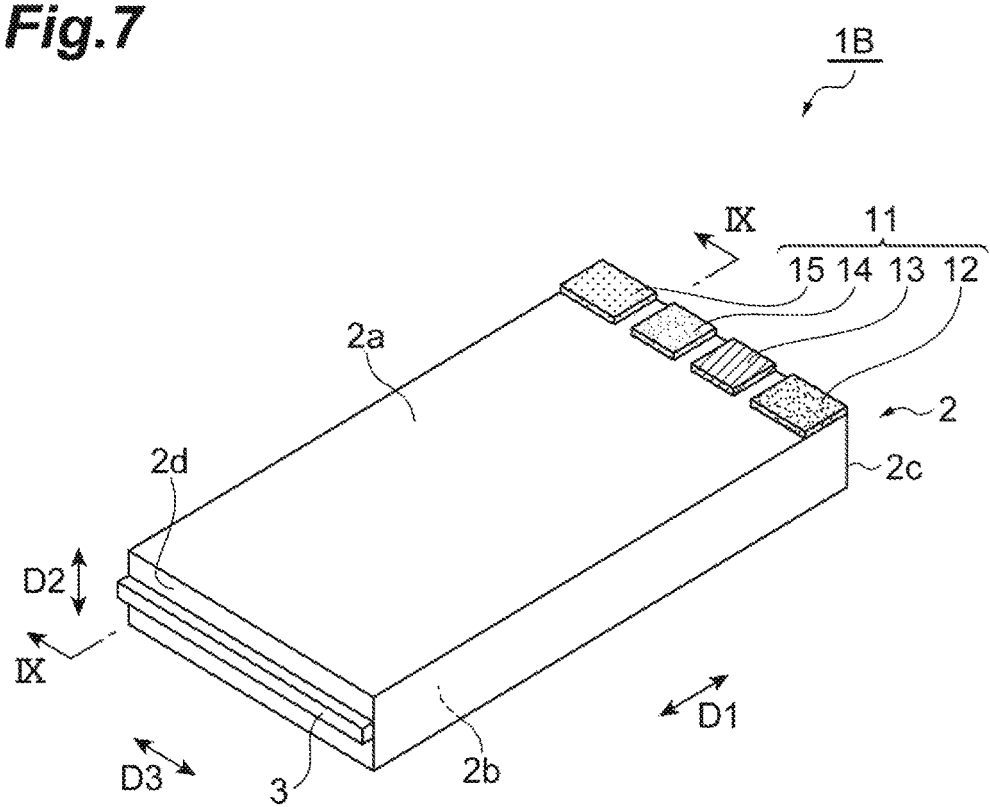
FIG. 7 is a perspective view illustrating a piezoelectric device according to a second embodiment.

FIG. 7 is a perspective view illustrating a piezoelectric device according to a second embodiment. A piezoelectric device 1B according to the second embodiment illustrated in FIG. 7 differs from the piezoelectric device 1A according to the first embodiment mainly in structures of electrode layers 11, 21, 31, and 41 in a body 2 and in arrangement of a friction member 3. Hereinafter, the piezoelectric device 1B will be described, focusing on these differences.

Figure 8:
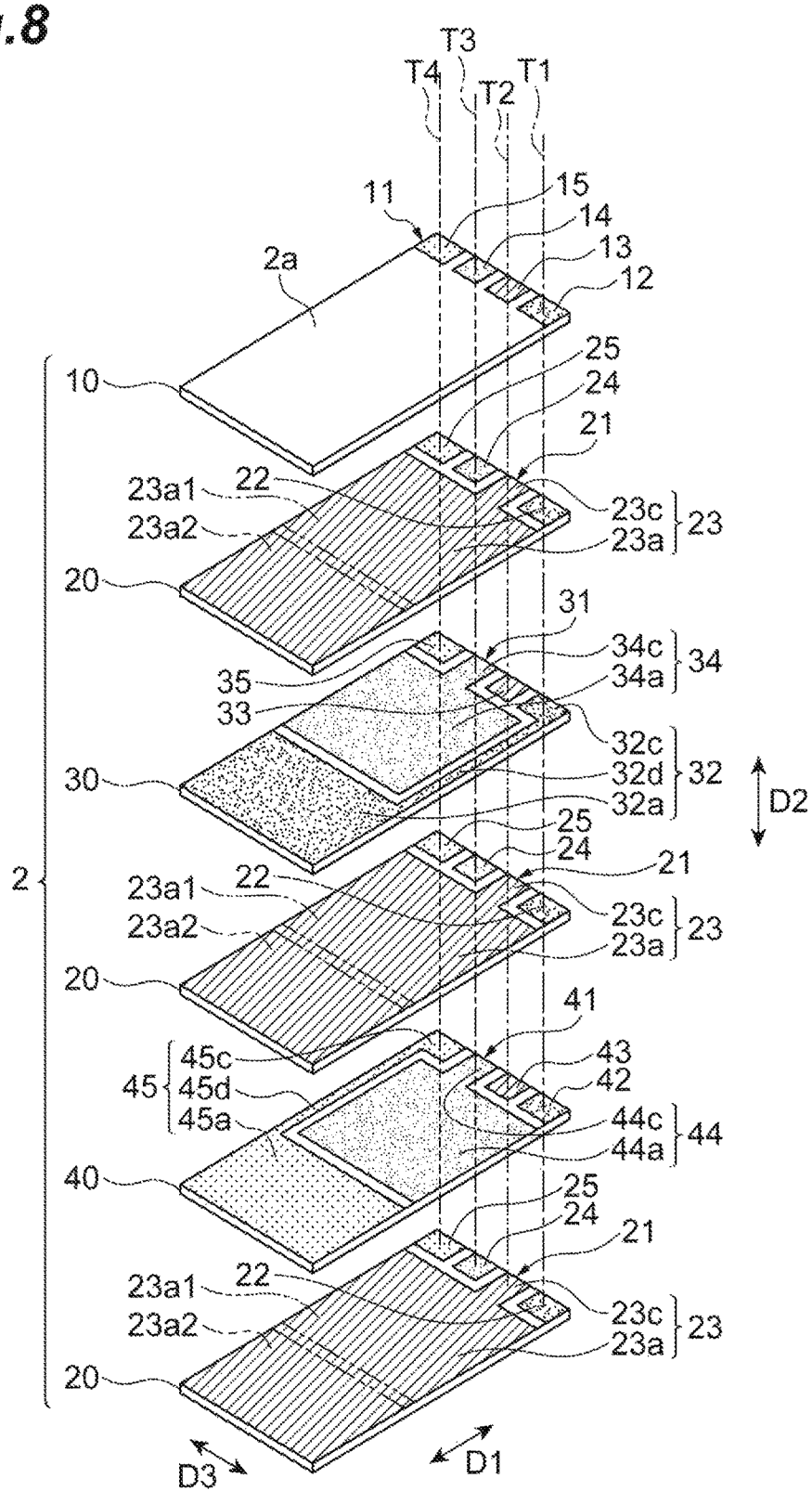
FIG. 8 is an exploded perspective view of a body illustrated in FIG. 7.
Figure 9:
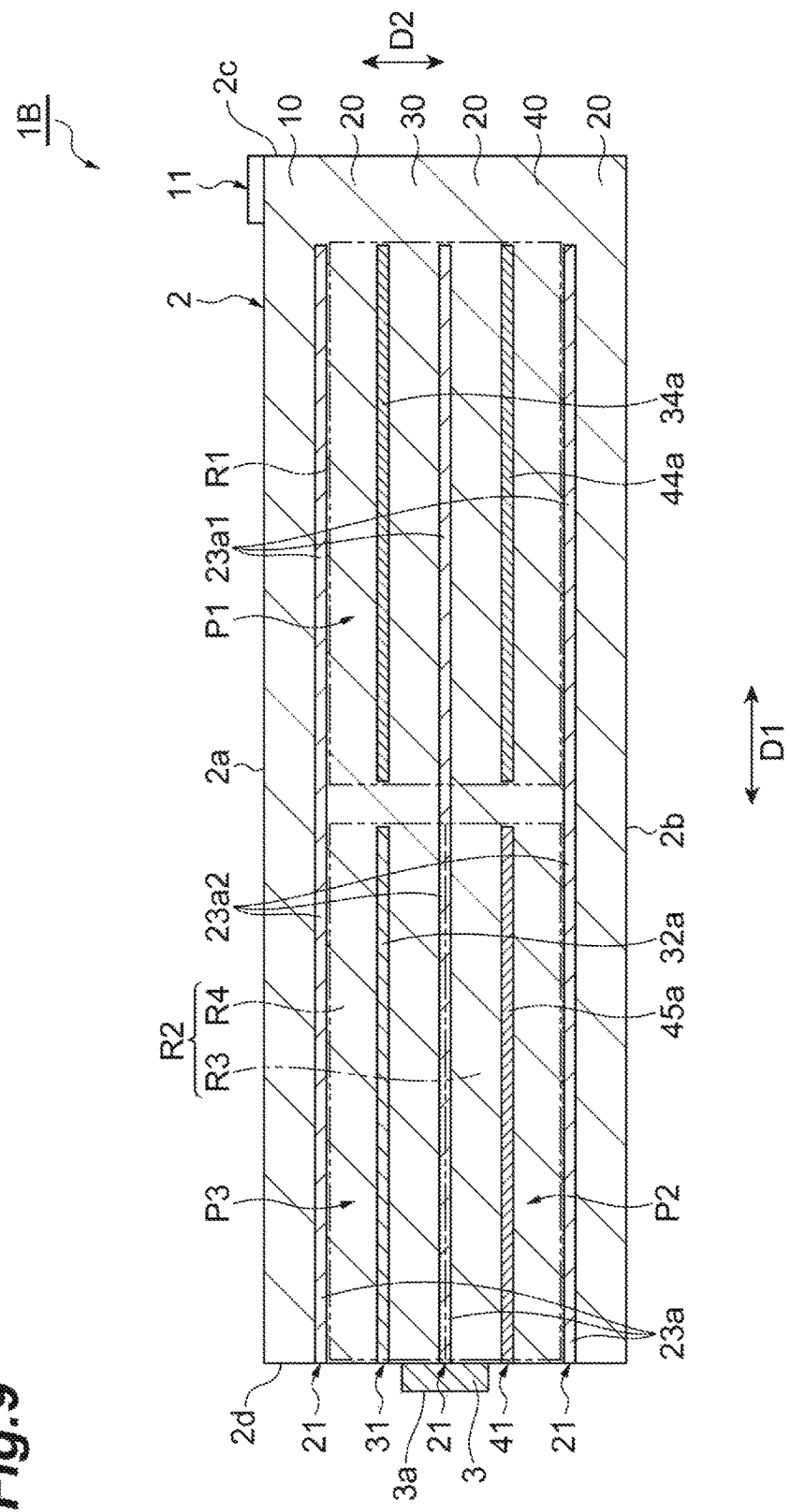
FIG. 9 is a cross sectional view taken along line IX-IX illustrated in FIG. 7.

FIG. 8 is an exploded perspective view of a body illustrated in FIG. 7. FIG. 9 is a cross sectional view taken along line IX-IX illustrated in FIG. 7. As illustrated in FIGS. 7 to 9, the electrode layer 11 is provided at an edge portion of an end surface 2c side in a top surface of a piezoelectric body layer 10. A first outside electrode 12, a ground outside electrode 13, a second outside electrode 14, and a third outside electrode 15 are aligned along the third direction D3 in the order mentioned at the edge portion of the end surface 2c side in the top surface of the piezoelectric body layer 10.

In the electrode layer 21, a ground electrode 23 includes a main electrode member 23a; and a connecting electrode member 23c. The main electrode member 23a is formed in a quadrilateral shape to cover the substantially entire region of a top surface of a piezoelectric body layer 20 except for an edge portion of the end surface 2c side. The main electrode member 23a includes an electrode part 23a1 overlapping with the after-mentioned main electrode member 34a, when seen from the second direction D2; and an electrode part 23a2 overlapping with the after-mentioned main electrode member 32a, when seen from the second direction D2. The connecting electrode member 23c is protruded from an edge portion of the main electrode member 23a of the end surface 2c side, formed in a quadrilateral shape to overlap with the ground outside electrode 13 disposed in the upper side, when seen from the second direction D2.

In the edge portion of the end surface 2c side in the top surface of the piezoelectric body layer 20, a first connecting electrode 22 is formed in a quadrilateral shape to overlap with the first outside electrode 12 disposed in the upper side, when seen from the second direction D2. In the edge portion of the end surface 2c side in the top surface of the piezoelectric body layer 20, a second connecting electrode 24 is formed in a quadrilateral shape to overlap with the second outside electrode 14 disposed in the upper side, when seen from the second direction D2. In the edge portion of the end surface 2c side in the top surface of the piezoelectric body layer 20, a third connecting electrode 25 is formed in a quadrilateral shape to overlap with the third outside electrode 15 disposed in the upper side, when seen from the second direction D2.

In the electrode layer 31, a first electrode 32 includes the main electrode member 32a; a connecting electrode member 32c; and a leading electrode member 32d. In the top surface of the piezoelectric body layer 30, the main electrode member 32a is formed in a quadrilateral shape to cover the substantially entire region ranging from the central position in the first direction D1 of the body 2 to the end surface 2d.

In an edge portion of the end surface 2c side in the top surface of the piezoelectric body layer 30, the connecting electrode member 32c is formed in a quadrilateral shape to overlap with the first outside electrode 12 disposed in the upper side, when seen from the second direction D2. The leading electrode member 32d is stretching along the first direction D1 at one edge portion in the third direction D3 of the piezoelectric body layer 30 and is configured to connect the main electrode member 32a and connecting electrode member 32c.

In the edge portion of the end surface 2c side in the top surface of the piezoelectric body layer 30, a ground connecting electrode 33 is formed in a quadrilateral shape to overlap with the ground outside electrode 13 disposed in the upper side, when seen from the second direction D2. A second electrode 34 includes the main electrode member 34a; and a connecting electrode member 34c. In the top surface of the piezoelectric body layer 30, the main electrode member 34a is formed in a quadrilateral shape to cover the substantially entire region ranging from an edge portion of the main electrode member 32a to the end surface 2c except for the edge portion of the end surface 2c side. In the edge portion of the end surface 2c side in the top surface of the piezoelectric body layer 30, the connecting electrode member 34c is formed in a quadrilateral shape to overlap with the second outside electrode 14 disposed in the upper side, when seen from the second direction D2. In the edge portion of the end surface 2c side in the top surface of the piezoelectric body layer 30, a third connecting electrode 35 is formed in a quadrilateral shape to overlap with the third outside electrode 15 disposed in the upper side, when seen from the second direction D2.

In regard to the electrode layer 41, in an edge portion of the end surface 2c side in a top surface of a piezoelectric body layer 40, a first connecting electrode 42 is formed in a quadrilateral shape to overlap with the first outside electrode 12 disposed in the upper side, when seen from the second direction D2. In the edge portion of the end surface 2c side in the top surface of the piezoelectric body layer 40, a ground connecting electrode 43 is formed in a quadrilateral shape to overlap with the ground outside electrode 13 disposed in the upper side, when seen from the second direction D2.

A second electrode 44 includes a main electrode member 44a; and a connecting electrode member 44c. In the top surface of the piezoelectric body layer 40, the main electrode member 44a is formed in a quadrilateral shape to cover the substantially entire region ranging from an edge portion of the after-mentioned main electrode member 45a to the end surface 2c except for the edge portion of the end surface 2c side. The connecting electrode member 44c is protruded from an edge portion of the main electrode member 44a on the end surface 2c side, formed in a quadrilateral shape to overlap with the second outside electrode 14 disposed in the upper side, when seen from the second direction D2.

A third electrode 45 includes the main electrode member 45a; a connecting electrode member 45c; and a leading electrode member 45d. In the top surface of the piezoelectric body layer 40, the main electrode member 45a is formed in a quadrilateral shape to cover the substantially entire region ranging from the central position in the first direction D1 to the end surface 2d. In the edge portion of the end surface 2c side in the top surface of the piezoelectric body layer 40, the connecting electrode member 45c is formed in a quadrilateral shape to overlap with the third outside electrode 15 disposed in the upper side, when seen from the second direction D2. The leading electrode member 45d is stretching along the first direction D1 at the other edge portion in the third direction D3 of the piezoelectric body layer 40 and is configured to connect the main electrode member 45a and connecting electrode member 45c.

In the piezoelectric device 1B, the friction member 3 is disposed on the end surface 2d. The friction member 3 is attached to a central position in the second direction D2 of the end surface 2d, stretching along the third direction D3.

Hereinafter, each region included in the body 2 will be described with reference to FIG. 9. Compared to the piezoelectric device 1A in which each region is defined in accordance with the main electrode members 23a and 23b (see FIG. 3), the piezoelectric device 1B is different in such a respect that each region is defined in accordance with electrode parts 23a1 and 23a2 as illustrated in FIG. 9. Specifically, a first region R1 is a region ranging from the uppermost electrode part 23a1 to the lowermost electrode part 23a1. The first region R1 includes a piezoelectric body P1, the electrode part 23a1 of the ground electrode 23 and the main electrode members 34a and 44a of the second electrodes 34 and 44, disposed in the piezoelectric body P1 to oppose each other in the second direction D2. The piezoelectric body P1 includes portions disposed between the uppermost electrode part 23a1 and the lowermost electrode part 23a1, in the piezoelectric body layers 20, 30, and 40. Specifically, the uppermost electrode part 23a1 and the lowermost electrode part 23a1 are disposed in the surfaces of the piezoelectric body P1, and others are disposed inside the piezoelectric body P1.

A second region R2 is a region ranging from the uppermost electrode part 23a2 to the lowermost electrode part 23a2. A third region R3 is a region ranging from an electrode part 23a2 serving as a boundary to the lowermost electrode part 23a2. A fourth region R4 is a region ranging from the electrode part 23a2 serving as the boundary to the uppermost electrode part 23a2. The third region R3 includes a piezoelectric body P2 the electrode part 23a2 of the ground electrode 23 and the main electrode member 45a of the third electrode 45, disposed in the piezoelectric body P2 to oppose each other in the second direction D2. The piezoelectric body P2 includes portions disposed between the electrode part 23a2 serving as the boundary and the lowermost electrode part 23a2, in the piezoelectric body layers 20 and 40. Specifically, the electrode part 23a2 serving as the boundary and the lowermost electrode part 23a2 are disposed in the surfaces of the piezoelectric body P2, and others are disposed inside the piezoelectric body P2.

The fourth region R4 includes a piezoelectric body P3 the electrode part 23a2 of the ground electrode 23 and the main electrode member 32a of the first electrode 32, disposed in the piezoelectric body P3 to oppose each other in the second direction D2. The piezoelectric body P3 includes portions disposed between the electrode part 23a2 serving as the boundary and uppermost electrode part 23a2, in the piezoelectric body layers 20 and 30. Specifically, the electrode part 23a2 serving as the boundary and the uppermost electrode part 23a2 are disposed in the surfaces of the piezoelectric body P3, and others are disposed inside the piezoelectric body P3.

Applying a voltage to the second outside electrode 14 generates an electric field between the main electrode members 34a, 44a and electrode part 23a1. Accordingly, the first region R1 deformably extends/contracts along the first direction D1. Applying a voltage to the third outside electrode 15 generates an electric field between the main electrode member 45a and electrode part 23a2. Accordingly, the third region R3 deformably extends/contracts along the first direction D1. Applying a voltage to the first outside electrode 12 generates an electric field between the main electrode member 32a and electrode part 23a2. Accordingly, the fourth region R4 deformably extends/contracts along the first direction D1.

Figure 10:
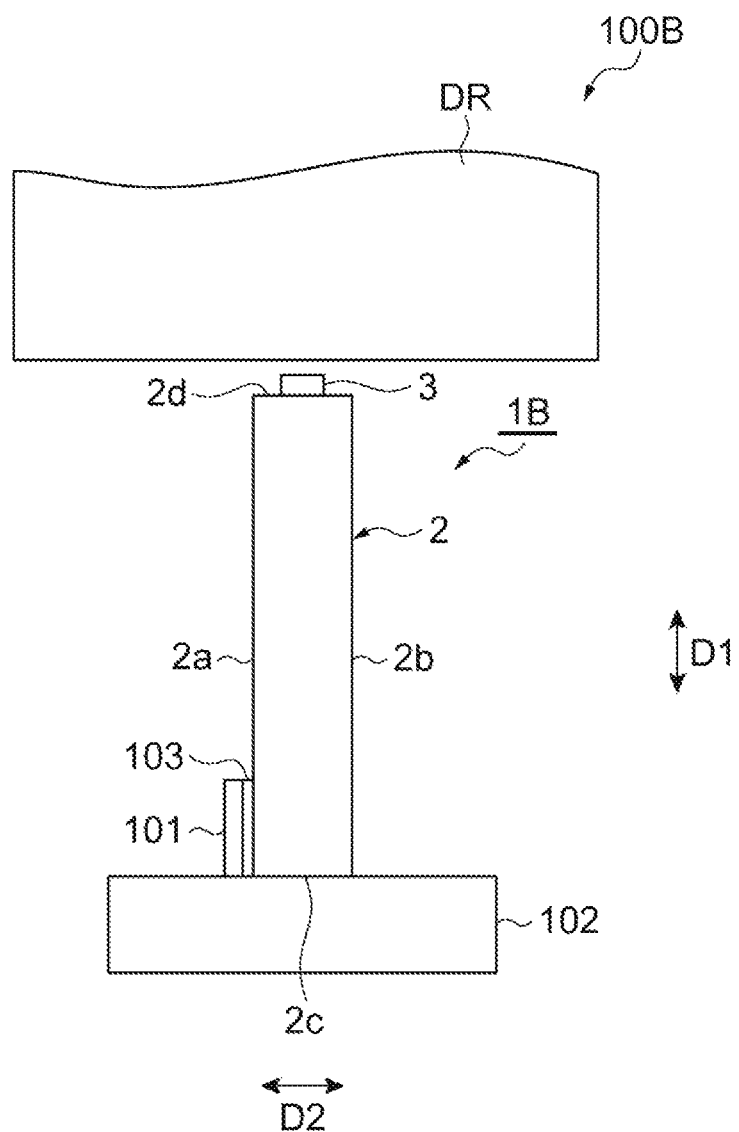
FIG. 10 is a side view of a piezoelectric actuator including the piezoelectric device illustrated in FIG. 7.

With reference to FIG. 10, hereinafter described is a structure of a piezoelectric actuator 100B in which the piezoelectric device 1B is applied. FIG. 10 is a side view of a piezoelectric actuator including the piezoelectric device illustrated in FIG. 7. As illustrated in FIG. 10, the piezoelectric actuator 100B differs from the piezoelectric actuator 100A in arrangement of a flexible substrate 101 since the electrode layer 11 (see FIG. 7) is provided at the edge portion of the end surface 2c side of the principal surface 2a. The flexible substrate 101 is disposed to be pressed on the edge portion of the end surface 2c side of the principal surface 2a. In the piezoelectric actuator 100B, the friction member 3 is provided on the end surface 2d. Thus, a driven body DR is disposed along the first direction D1, opposing the end surface 2d.

With reference to FIGS. 5A to 5C and FIGS. 11A to 11G, hereinafter described is a process to drive the piezoelectric actuator 100B. FIGS. 11A to 11G are views for describing a process to drive the piezoelectric actuator illustrated in FIG. 10.

Figure 11:
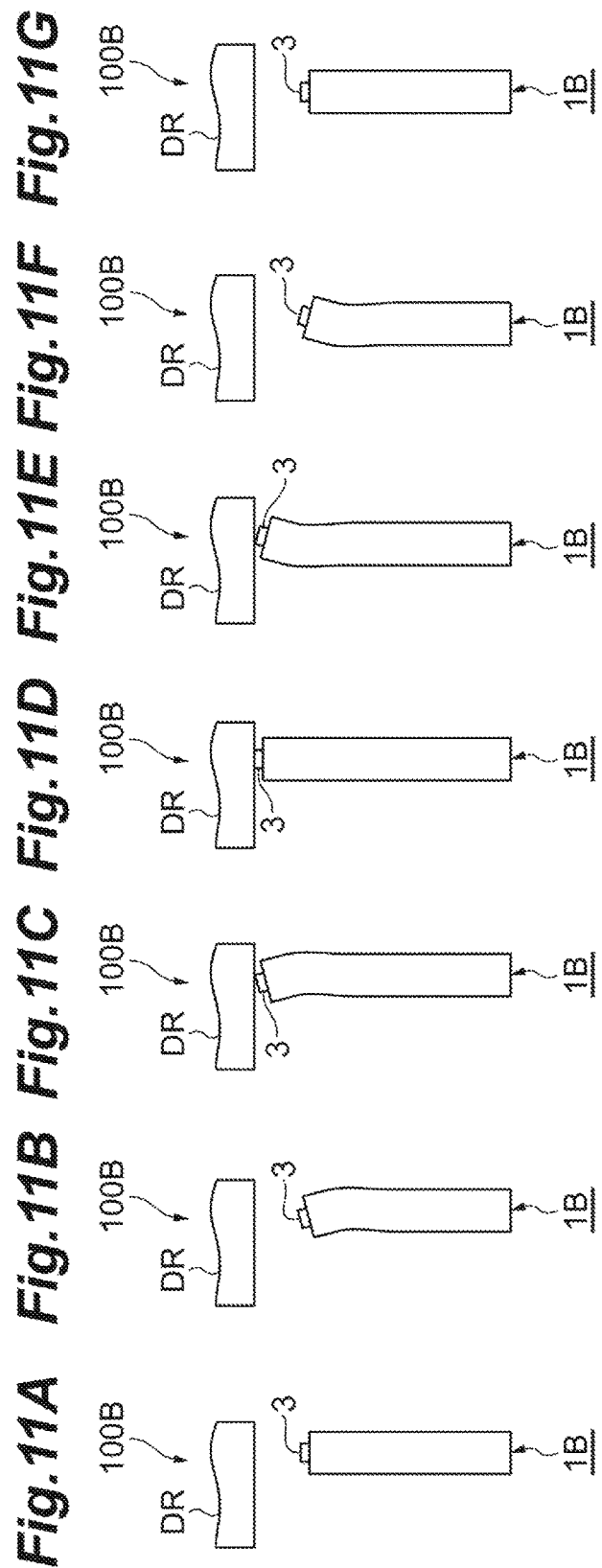
FIGS. 11A to 11G are views for describing a process to drive the piezoelectric actuator illustrated in FIG. 10.

FIG. 11A shows a state before driving the piezoelectric actuator 100B. Herein, (V1, V2, V3)=(0, 0, 0) and the first region R1, third region R3, and fourth region R4 are in a state before deformation. Therefore, the friction member 3 is separated from the driven body DR.

FIG. 11B shows a state of the time t1. As illustrated in FIGS. 5A to 5C, in the time t1, (V1, V2, V3)=(V, 0, −V). Therefore, the fourth region R4 deforms to contract along the first direction D1, and the third region R3 deforms to extend along the first direction D1. Accordingly, as illustrated in FIG. 11B, the second region R2 deformably curves in such a manner that the third region R3 side curves outward.

FIG. 11C shows a state of the time t2. As illustrated in FIGS. 5A to 5C, in the time t2, (V1, V2, V3)=(V, −V, −V). Therefore, the first region R1 deforms to extend along the first direction D1. Accordingly, as illustrated in FIG. 11C, the friction member 3 is brought into contact with the driven body DR with the second region R2 being deformably curved.

FIG. 11D shows a state where (V1, V2, V3)=(0, −V, 0) when the state of the time t2 transfers to that of the time t3. The third region R3 and fourth region R4 return to the state before deformation while the first region R1 deforms to extend. Accordingly, as illustrated in FIG. 11D, the driven body DR is driven along the second direction D2.

FIG. 11E shows a state of the time t3. As illustrated in FIGS. 5A to 5C, in the time t3, (V1, V2, V3)=(−V, −V, V). Therefore, the fourth region R4 deforms to extend along the first direction D1 and the third region R3 deforms to contract along the first direction D1. Accordingly, as illustrated in FIG. 11E, the second region R2 deformably curves in such a manner that the fourth region R4 side curves outward and the driven body DR is further driven along the second direction D2.

FIG. 11F shows a state of the time t4. As illustrated in FIGS. 5A to 5C, in the time t4, (V1, V2, V3)=(−V, 0, V). Therefore, the first region R1 returns to the state before deformation. Accordingly, as illustrated in FIG. 11F, the first region R1 is contracted along the first direction D1 with the second region R2 being curved.

FIG. 11G shows a state after driving the piezoelectric actuator 100B. The first region R1, third region R3, and fourth region R4 return to the state before driving. On the other hand, the driven body DR further moves along the second direction D2 compared to the state before driving.

Third Embodiment

Figure 12:
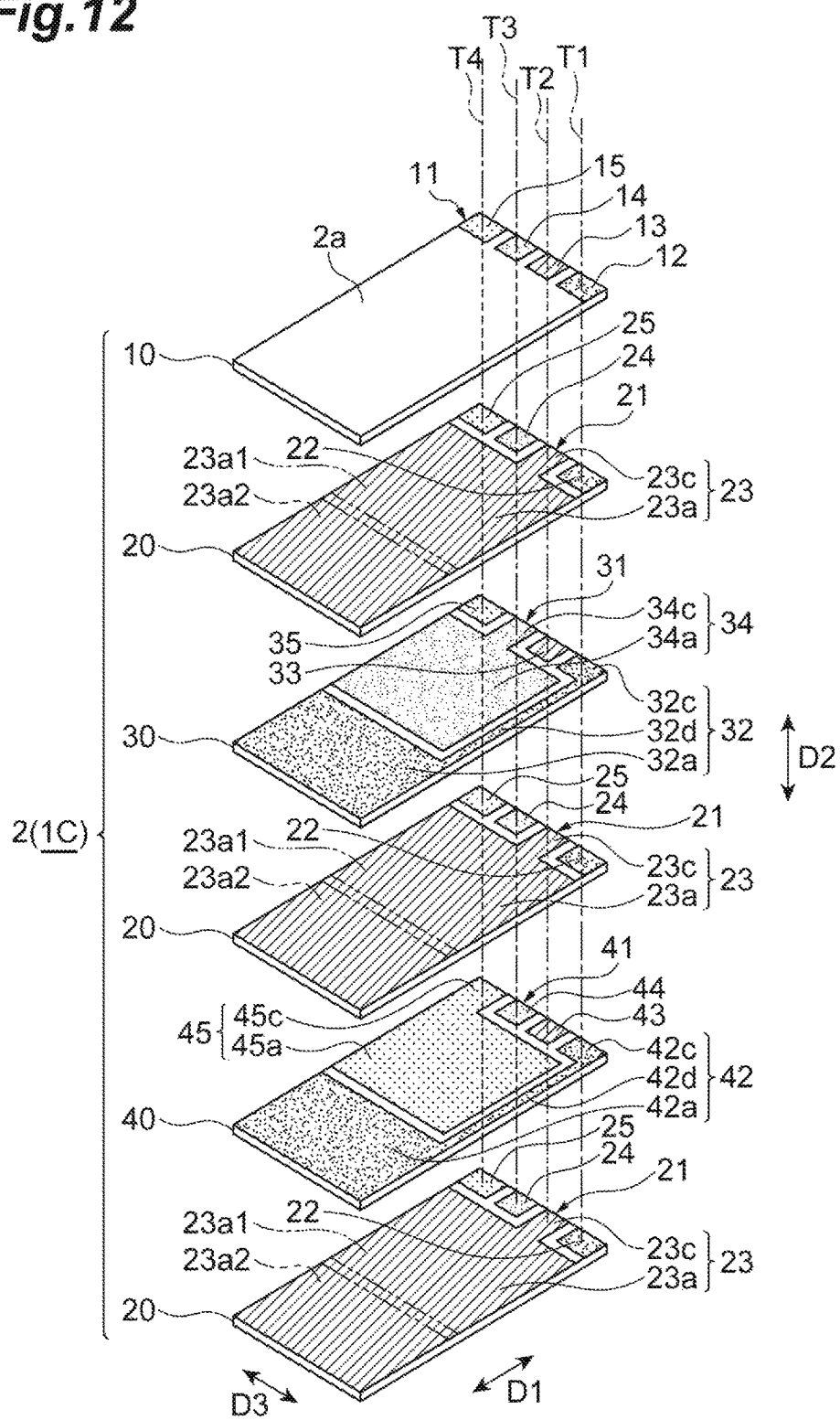
FIG. 12 is an exploded perspective view of a body of a piezoelectric device according to a third embodiment.
Figure 13:
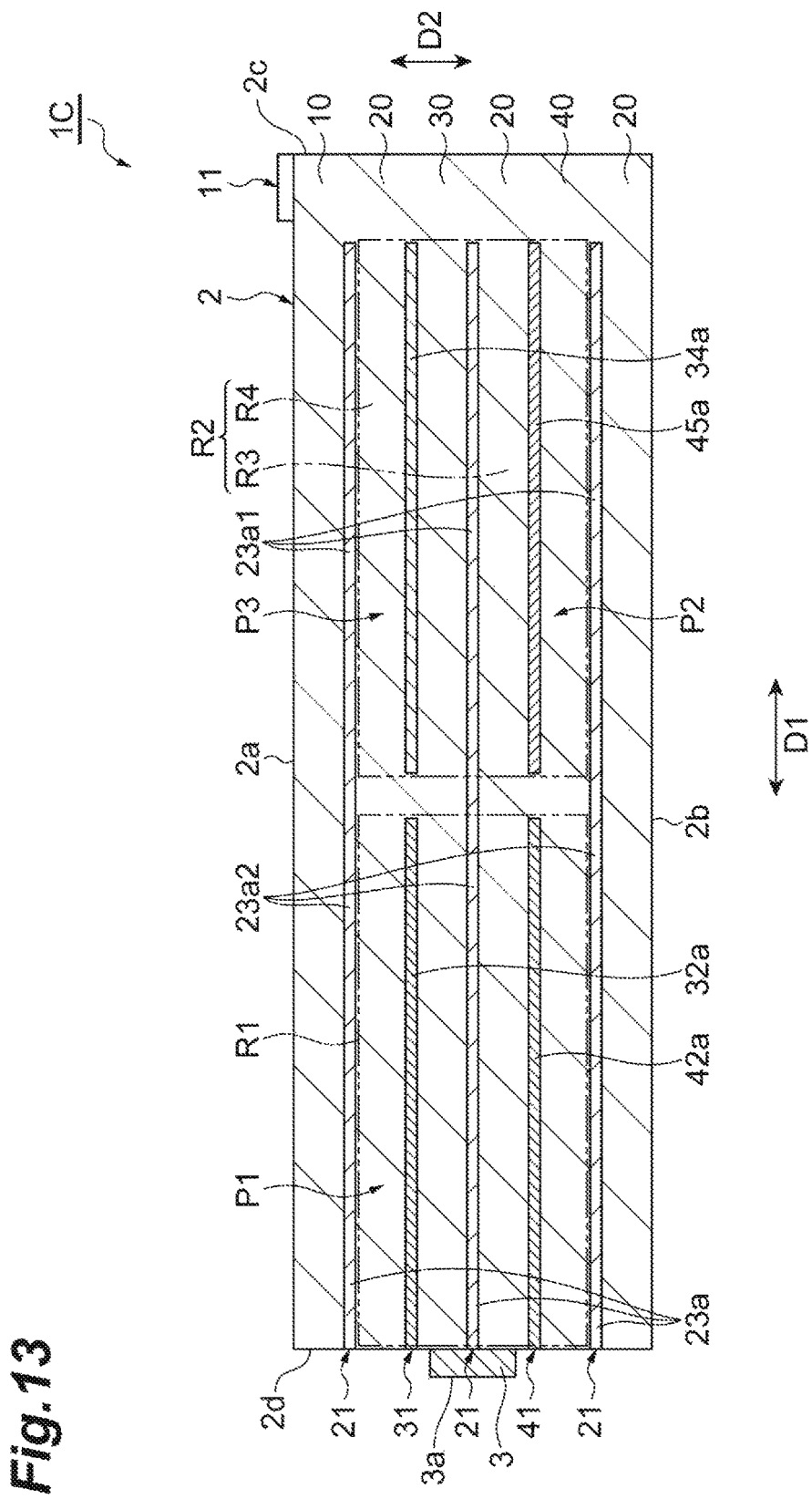
FIG. 13 is a cross sectional view of the piezoelectric device according to the third embodiment.

FIG. 12 is an exploded perspective view of a body of a piezoelectric device according to a third embodiment. FIG. 13 is a cross sectional view of the piezoelectric device according to the third embodiment. A piezoelectric device 1C according to the third embodiment illustrated in FIGS. 12, 13 differs from the piezoelectric device 1B according to the second embodiment mainly in a structure of an electrode layer 41. Hereinafter, the piezoelectric device 1C will be described, focusing on the difference.

The electrode layer 41 includes a first electrode 42; a ground connecting electrode 43; a second connecting electrode 44; and a third electrode 45, all of which are electrically insulated from each other. The structure of the first electrode 42 is similar to that of the first electrode 32 in the electrode layer 31, and the first electrode 42 is equivalent to the first electrode 32, when seen from the second direction D2. In other words, the first electrode 42 includes a main electrode member 42a; a connecting electrode member 42c; and a leading electrode member 42d. In a top surface of a piezoelectric body layer 40, the main electrode member 42a is formed in a quadrilateral shape to cover the substantially entire region ranging from a central position in the first direction D1 of a body 2 to an end surface 2d. In an edge portion of an end surface 2c side in the top surface of the piezoelectric body layer 40, the connecting electrode member 42c is formed in a quadrilateral shape to overlap with a first outside electrode 12 disposed in the upper side, when seen from the second direction D2. The leading electrode member 42d is stretching along the first direction D1 at one edge portion in the third direction D3 of the piezoelectric body layer 40 and is configured to connect the main electrode member 42a and connecting electrode member 42c.

In the edge portion of the end surface 2c side in the top surface of the piezoelectric body layer 40, the ground connecting electrode 43 is formed in a quadrilateral shape to overlap with a ground outside electrode 13 disposed in the upper side, when seen from the second direction D2. In the edge portion of the end surface 2c side in the top surface of the piezoelectric body layer 40, the second connecting electrode 44 is formed in a quadrilateral shape to overlap with a second outside electrode 14 disposed in the upper side, when seen from the second direction D2. The third electrode 45 includes a main electrode member 45a; and a connecting electrode member 45c. In the top surface of the piezoelectric body layer 40, the main electrode member 45a is formed in a quadrilateral shape to cover the substantially entire region ranging from an edge portion of the main electrode member 42a to the end surface 2c except for the edge portion of the end surface 2c side. In the edge portion of the end surface 2c side in the top surface of the piezoelectric body layer 40, the connecting electrode member 45c is formed in a quadrilateral shape to overlap with a third outside electrode 15 disposed in the upper side, when seen from the second direction D2.

Hereinafter, each region included in the body 2 will be described with reference to FIG. 13. As illustrated in FIG. 13, the piezoelectric device 1C differs from the piezoelectric device 1B in that a first region R1 is on the end surface 2d side and a second region R2 is on the end surface 2c side, thus a friction member 3 is provided at the first region R1 of the body 2. Specifically, the first region R1 is a region ranging from the uppermost electrode part 23a2 to the lowermost electrode part 23a2. The first region R1 includes a piezoelectric body P1, the electrode part 23a2 of the ground electrode 23 and the main electrode members 32a and 42a of the first electrodes 32 and 42, disposed in the piezoelectric body P1 to oppose each other in the second direction D2. The piezoelectric body P1 includes portions disposed between the uppermost electrode part 23a2 and lowermost electrode part 23a2, in piezoelectric body layers 20, 30, and 40. Specifically, the uppermost electrode part 23a2 and the lowermost electrode part 23a2 are disposed in the surfaces of the piezoelectric body P1, and other electrode parts are disposed inside the piezoelectric body P1.

The second region R2 is a region ranging from the uppermost electrode part 23a1 to the lowermost electrode part 23a1. A third region R3 is a region ranging from an electrode part 23a1 serving as a boundary to the lowermost electrode part 23a1. A fourth region R4 is a region ranging from the electrode part 23a1 serving as the boundary to the uppermost electrode part 23a1. The third region R3 includes a piezoelectric body P2, the electrode part 23a1 of the ground electrode 23 and main electrode member 45a of the third electrode 45, disposed in the piezoelectric body P2 to oppose each other in the second direction D2. The piezoelectric body P2 includes portions between the electrode part 23a1 serving as the boundary and lowermost electrode part 23a1, in the piezoelectric body layers 20 and 40. Specifically, the electrode part 23a1 serving as the boundary and the lowermost electrode part 23a1 are disposed in the surfaces of the piezoelectric body P2, and others are disposed inside the piezoelectric body P2.

The fourth region R4 includes a piezoelectric body P3, the electrode part 23a1 of the ground electrode 23 and the main electrode member 34a of the second electrode 34, disposed in the piezoelectric body P3 to oppose each other in the second direction D2. The piezoelectric body P3 includes portions disposed between the electrode part 23a1 serving as the boundary and uppermost electrode part 23a1, in the piezoelectric body layers 20 and 30. Specifically, the electrode part 23a1 serving as the boundary and the uppermost electrode part 23a1 are disposed in the surfaces of the piezoelectric body P3, and others are disposed inside the piezoelectric body P3.

Applying a voltage to the first outside electrode 12 generates an electric field between the main electrode member 32a and electrode part 23a2. Accordingly, the first region R1 deformably extends/contracts along the first direction D1. Applying a voltage to the third outside electrode 15 generates an electric field between the main electrode member 45a and electrode part 23a1. Accordingly, the third region R3 deformably extends/contracts along the first direction D1. Applying a voltage to the second outside electrode 14 generates an electric field between the main electrode member 34a and electrode part 23a1. Accordingly, the fourth region R4 deformably extends/contracts along the first direction D1.

With reference to FIGS. 5A to 5C and FIGS. 14A to 14G, hereinafter described is a process to drive a piezoelectric actuator 100C in which the piezoelectric device 1C is applied. FIGS. 14A to 14G are side views for describing a process to drive a piezoelectric actuator according to the third embodiment. Structures of the piezoelectric actuator 100C and the piezoelectric actuator 100B are different in that the former includes the piezoelectric device 1C instead of the piezoelectric device 1B, and they are equivalent in other respects.

FIG. 14A shows a state before driving the piezoelectric actuator 100C. Herein, (V1, V2, V3)=(0, 0, 0) and the first region R1, third region R3, and fourth region R4 are in a state before deformation. Thus, the friction member 3 is separated from the driven body DR.

FIG. 14B shows a state of the time t1. As illustrated in FIGS. 5A to 5C, in the time t1, (V1, V2, V3)=(V, 0, −V). Therefore, the fourth region R4 deforms to contract along the first direction D1, and the third region R3 deforms to extend along the first direction D1. Accordingly, as illustrated in FIG. 14B, the second region R2 deformably curves in such a manner that the third region R3 side curves outward.

FIG. 14C shows a state of the time t2. As illustrated in FIGS. 5A to 5C, in the time t2, (V1, V2, V3)=(V, −V, −V). Therefore, the first region R1 deforms to extend along the first direction D1. Accordingly, as illustrated in FIG. 14C, the friction member 3 is brought into contact with the driven body DR with the second region R2 being deformably curved.

FIG. 14D shows a state where (V1, V2, V3)=(0, −V, 0) when the state of the time t2 transfers to that of the time t3. The third region R3 and fourth region R4 return to the state before deformation while the first region R1 deforms to extend. Accordingly, as illustrated in FIG. 14D, the driven body DR is driven along the second direction D2.

FIG. 14E shows a state of the time t3. As illustrated in FIGS. 5A to 5C, in the time t3, (V1, V2, V3)=(−V, −V, V). Therefore, the fourth region R4 deforms to extend along the first direction D1 and the third region R3 deforms to contract along the first direction D1. Accordingly, as illustrated in FIG. 14E, the second region R2 deformably curves in such a manner that the fourth region R4 side curves outward and the driven body DR is further driven along the second direction D2.

FIG. 14F shows a state of the time t4. As illustrated in FIGS. 5A to 5C, in the time t4, (V1, V2, V3)=(−V, 0, V). Therefore, the first region R1 returns to the state before deformation. Accordingly, as illustrated in FIG. 14F, the first region R1 is contracted along the first direction D1 with the second region R2 being curved.

FIG. 14G shows a state after driving the piezoelectric actuator 100C. The first region R1, third region R3, and fourth region R4 return to the state before driving. On the other hand, the driven body DR further moves along the second direction compared to the state before driving.

As described above, in the piezoelectric devices 1A, 1B, and 1C, the body 2 includes the first region R1 configured to extend/contract deformably; and the second region R2 configured to curve deformably. Therefore, in the piezoelectric device 1A, the first region R1 deformably extends/contracts while the second region R2 deformably curves and the principal surface 2b to be curved outward is brought into contact with the driven body DR. Thus, the driven body DR can be displaced along the first direction D1. In the piezoelectric devices 1B and 1C, the second region R2 deformably curves while the first region R1 deforms to extend and the end surface 2d is brought into contact with the driven body DR. Thus, the driven body DR can be displaced along the second direction D2. As mentioned above, in the piezoelectric devices 1A, 1B, and 1C, it is possible to separately control the force to contact with the driven body DR and the force to drive the driven body DR. Therefore, each force can be adjusted easily. Accordingly, it is possible to displace the driven body DR stably, which enhances reliability. After the friction member 3 is brought into contact with the driven body DR, the driven body DR can be driven. Thus, the friction between the friction member 3 and driven body DR is static friction. Thus, abrasion resistance of the friction member 3 improves compared to a case where the friction between the friction member 3 and driven body DR is kinetic friction.

In the piezoelectric device 1A, the driven body DR is driven by extension/contraction of the first region R1. Therefore, drive force is high. In the piezoelectric device 1A, the friction member 3 is brought into contact with the driven body DR as the second region R2 deformably curves. Therefore, frictional force tends to be low. However, in the piezoelectric actuator 100A, the flexible substrate 101 is disposed to be pressed on the principal surface 2a. Accordingly, sufficient frictional force can be maintained.

Figure 15A:
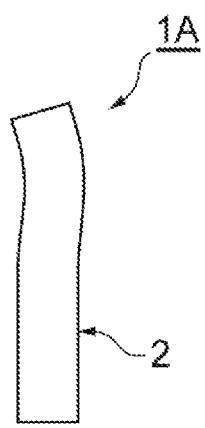
FIGS. 15A to 15C are views for describing effects on deformation of the body wielded by pressing force of a flexible substrate.
Figure 15B:
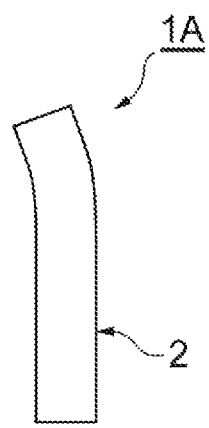
Figure 15C:
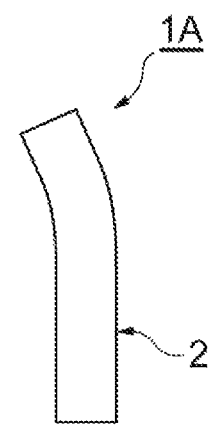

FIGS. 15A to 15C are views for describing effects on deformation of the body wielded by pressing force of a flexible substrate. The friction member 3 (see FIG. 4) is omitted in the drawings. In the piezoelectric device 1A, as illustrated in FIG. 15A, in a case where the pressing force is strong, the friction member 3 can be brought into contact with the driven body DR (see FIG. 4) with the sufficient force. As illustrated in FIG. 15B, in a case where the pressing force is weak, the friction member 3 cannot be sufficiently brought into contact with the driven body DR. As illustrated in FIG. 15C, in a case where there is no pressing force, the body 2 deforms to be separated from the driven body DR and the friction member 3 may not be brought into contact with the driven body DR.

In the piezoelectric device 1B, the second region R2 is disposed on the driven body DR side and deformably curves at a position close to the driven body DR. Therefore, due to the deformable curve of the second region R2, there is no need to move the first region R1. In the piezoelectric device 1C, the second region R2 is disposed on the fixing unit 102 side and deformably curves at a position far from the driven body DR. Therefore, the deformable curve of the second region R2 moves the first region R1 and increases an amount of displacement of the driven body DR.

In the piezoelectric devices 1A, 1B, and 1C, the second region R2 includes the third region R3 and fourth region R4 lined along the second direction D2, and the third region R3 and fourth region R4 deformably extend/contract along the first direction D1, independently of each other. Therefore, it is possible to deform one of the third region R3 and fourth region R4 along the first direction D1 to extend and to deform the other to contract. Accordingly, it is possible to easily and deformably curve the second region R2.

In the piezoelectric devices 1A, 1B, and 1C, it is preferable to provide three electrodes having different potential such as the first electrode, second electrode, and third electrode, other than the ground electrode 23. Therefore, the structures of the electrodes can be simplified.

The piezoelectric devices 1A, 1B, and 1C include the friction member 3. Thus, abrasion of the body 2 can be prevented. Furthermore, in the piezoelectric device 1A, the friction member 3 is disposed to overlap with the central part in the first direction D1 of the second region R2, when seen from the second direction D2. The central part in first direction D1 of the second region R2 is a part where deflection caused by the curve becomes the largest. Therefore, this arrangement enhances the force to bring the friction member 3 into contact with the driven body DR. The arrangement of the friction member 3 may be other than this.

In the piezoelectric device 1A, the electrodes in the first region R1 and second region R2 are disposed symmetrically in the vertical direction. In other words, each of the main electrode members 23a, 34a and 44a in the first region R1 thoroughly overlaps with each other, when seen from the second direction D2, and each of the main electrode members 23b, 32a, and 45a in the second region R2 thoroughly overlaps with each other, when seen from the second direction D2. Therefore, the piezoelectrically-active piezoelectric body layers (active layers) in the first region R1 are disposed symmetrically in the vertical direction, and the active layers in the second region R2 are disposed symmetrically in the vertical direction. Thus, it is possible to carry out ideal and vertically-symmetrical drive in the piezoelectric device 1A.

On the other hand, in the piezoelectric device 1B, each of the main electrode members 34a, 44a and the electrode part 23a1 in the first region R1 do not overlap thoroughly, when seen from the second direction D2. Therefore, the active layers in the first region R1 are disposed asymmetrically in the vertical direction. In the piezoelectric device 1C, the main electrode members 34a, 45a, and the electrode part 23a1 in the second region R2 do not thoroughly overlap with each other, when seen from the second direction D2. Therefore, the active layers in the first region R1 are disposed asymmetrically in the vertical direction. Thus, it is difficult to carry out the ideal and vertically-symmetrical drive in the piezoelectric devices 1B and 1C.

In the piezoelectric device 1A, the electrode layer 11 or the outside electrode is disposed in the central part in the first direction D1 of the body 2. Therefore, the conductive resin 103 provided on the electrode layer 11 serves as resistance. Accordingly, the body 2 may be restricted from deforming. On the other hand, in the piezoelectric devices 1B and 1C, the electrode layers 11 are collectively disposed in the edge portion of the fixing unit 102 side of the body 2. Therefore, the conductive resin 103 provided on the electrode layer 11 hardly serves as resistance. Accordingly, the body 2 may not be restricted from deforming. In the piezoelectric device 1A, the central part in the first direction D1 of the body 2 serves as the piezoelectric body layer (inactive layer) which is piezoelectically inactive. On the other hand, in the piezoelectric device 1B and 1C, the inactive layers can be collectively disposed in the edge portion of the fixing unit 102 side of the body 2. Therefore, compared to the piezoelectric device 1A, it is possible to reduce the resistance during driving due to the inactive layers.

In the piezoelectric device 1A, the electrodes included in the electrode layer 11 are all disposed in the central part in the first direction D1 of the body 2. Therefore, in the piezoelectric device 1A, there is no need to provide an electrode member configured to connect the connecting electrode member and main electrode member like the leading electrode members 32d and 45d in the piezoelectric device 1B and the leading electrode members 32d and 42d in the piezoelectric device 1C. Therefore, the piezoelectric device 1A may increase area of each main electrode member and the number of the active layers, compared to the piezoelectric devices 1B and 1C. Thus, it is possible to increase a volume of drive.

The embodiments according to an aspect of the present invention have been described. However, the present invention is not necessarily restricted to the aforementioned embodiments and can be modified within the range of the gist of the present invention.

For example, the piezoelectric devices 1A, 1B, and 1C do not necessarily include the friction member 3. In this case, a part in the body 2 which is to be brought into contact with the driven body DR may be coated with DLC and the like for preventing abrasion. For example, coating may be applied to the principal surface 2b in the piezoelectric device 1A or the end surface 2d in each of the piezoelectric devices 1B and 1C. Since DLC has high thermal conductivity, even when the body 2 generates heat, the heat can be easily emitted to the driven body DR, which enhances the reliability. However, the coating may restrict the body 2 from deforming, which may decrease the amount of displacement. In the body 2, not only the part with the largest deflection caused by the curve but also its periphery is easily brought into contact with the driven body DR. Therefore, the abrasion occurs in a wide range of the body 2 and the heat is likely to increase.

In the piezoelectric devices 1A, 1B, and 1C, a length of the first region R1 along the first direction D1 and a length of the second region R2 along the first direction D1 are different from each other. In this case, it is possible to easily adjust a magnitude of the force to drive the driven body DR and that of the force to contact with the driven body DR. In the piezoelectric device 1A, the longer the length of the first region R1 along the first direction D1, the stronger the force to drive the driven body DR; and the longer the length of the second region R2 along the first direction D1, the stronger the force to contact with the driven body DR. In the piezoelectric devices 1B and 1C, the longer the length of the first region R1 along the first direction D1, the stronger the force to contact with the driven body DR; and the longer the length of the second region R2 along the first direction D1, the stronger the force to drive the driven body DR.

In the piezoelectric devices 1A, 1B, and 1C, the second region R2 is preferably configured to curve deformably and the second region R2 may include, for example, any one of the third region R3 and fourth region R4. In this case, the number of the active layers in the second region R2 decreases. Accordingly, although the amount of displacement decreases, the number of the electrodes can be reduced.

Figure 16:
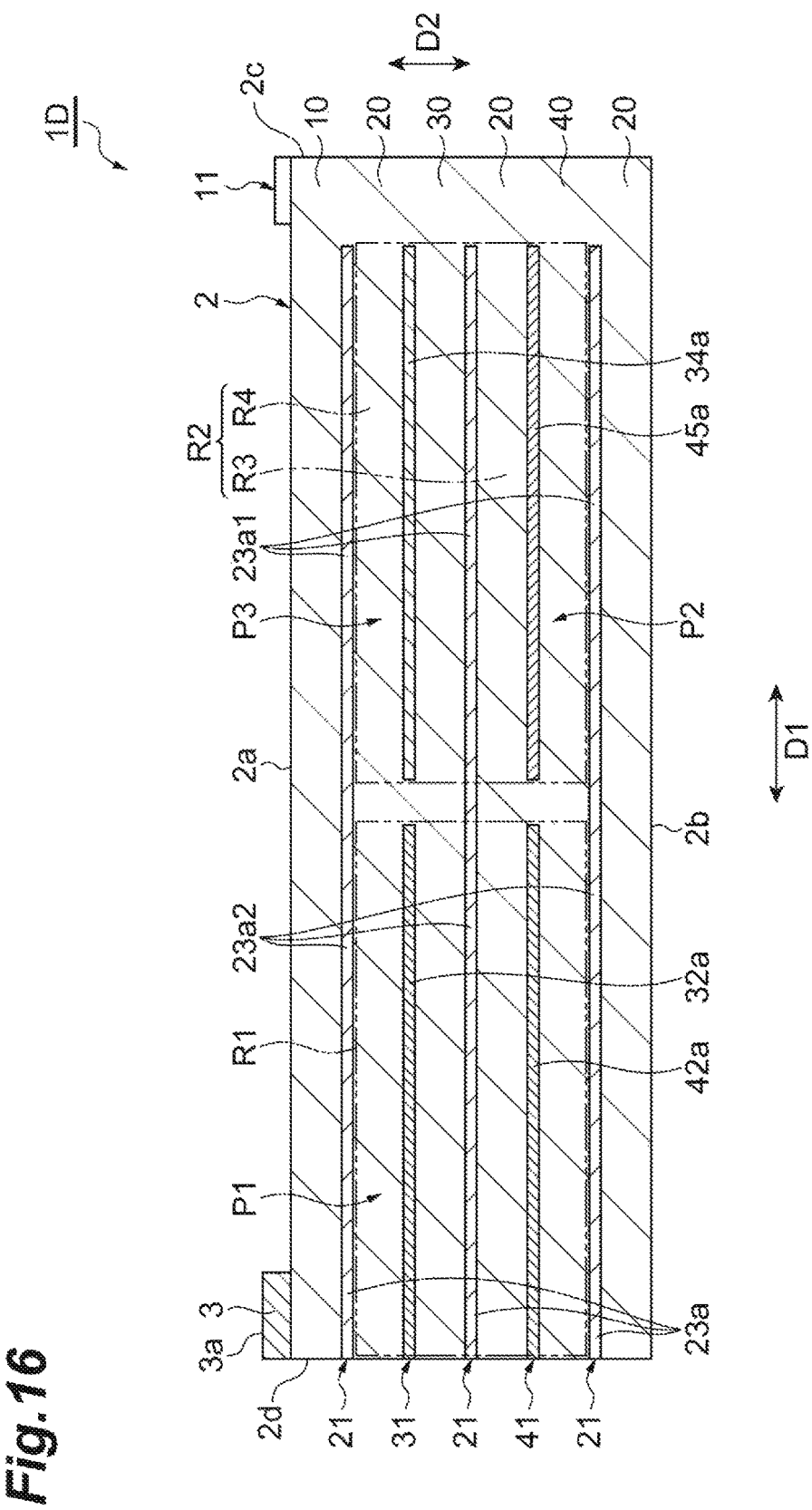
FIG. 16 is a cross sectional view illustrating a modification of the piezoelectric device according to the third embodiment.

FIG. 16 is a cross sectional view illustrating a modification of the piezoelectric device according to the third embodiment. As illustrated in FIG. 16, a piezoelectric device 1D according to the modification differs from the piezoelectric device 1C in that a friction member 3 is provided at an edge portion on an end surface 2d side of a principal surface 2a, but they are equivalent in structure of a body 2. In the piezoelectric device 1D, a driven body DR can be driven along the first direction D1 as similar to the piezoelectric device 1A.

What is claimed is:
1. A piezoelectric device, comprising:
    a body including a first region, a second region and a fifth region aligned along a first direction, the second region including a third region and a fourth region aligned along a second direction, and the body including a pair of principal surfaces opposing each other along the second direction, wherein
    the first region includes: a first piezoelectric body; and a first electrode and a second electrode disposed in the first piezoelectric body to oppose each other,
    the third region includes: a second piezoelectric body; and a third electrode and a fourth electrode disposed in the second piezoelectric body to oppose each other, and
    the fourth region includes a third piezoelectric body; and a fifth electrode and a sixth electrode disposed in the third piezoelectric body to oppose each other; and
    an outside electrode disposed on one of the pair of principal surfaces, wherein the outside electrode overlaps with the fifth region when viewed from the second direction, the fifth region being a piezoelectrically-inactive region that connects the first region and the second region to the outside electrode, when a voltage is applied to the outside electrode, the first region deformably extends/contracts along the first direction and the second region deformably curves in such a manner that one or the other side in a second direction intersecting the first direction curves outward, and the third region and the fourth region deformably extend/contract along the first direction, independently of each other.

2. The piezoelectric device according to claim 1, wherein the second electrode, the fourth electrode, and the sixth electrode are ground electrodes.

3. The piezoelectric device according to claim 1, further comprising:

a friction member provided on the body and configured to be brought into contact with a driven body.

4. The piezoelectric device according to claim 3, wherein the friction member is provided on the second region side.

5. The piezoelectric device according to claim 1, wherein a length of the first region along the first direction and a length of the second region along the first direction are different from each other.

6. The piezoelectric device according to claim 1, wherein the first region and the second region are the only piezoelectrically-active regions in the body.

7. The piezoelectric device according to claim 1, wherein the fifth region is disposed between the first region and the second region.

8. The piezoelectric device according to claim 1, wherein the second region is disposed between the first region and the fifth region.

* * * * *